(12) United States Patent
Liao et al.

(10) Patent No.: US 12,230,611 B2
(45) Date of Patent: Feb. 18, 2025

(54) LIGHT-EMITTING DEVICE AND DISPLAY SCREEN INCLUDING THE SAME

(71) Applicant: QUANZHOU SANAN SEMICONDUCTOR TECHNOLOGY CO., LTD., Nanan (CN)

(72) Inventors: Yanqiu Liao, Fujian (CN); Junpeng Shi, Fujian (CN); Shuning Xin, Fujian (CN); Chen-ke Hsu, Fujian (CN); Zhen-duan Lin, Fujian (CN); Changchin Yu, Fujian (CN); Aihua Cao, Fujian (CN); Chi-Wei Liao, Fujian (CN); Zheng Wu, Fujian (CN); Chia-en Lee, Fujian (CN)

(73) Assignee: QUANZHOU SANAN SEMICONDUCTOR TECHNOLOGY CO., LTD., Fujian (CN)

( * ) Notice: Subject to any disclaimer, the term of this patent is extended or adjusted under 35 U.S.C. 154(b) by 497 days.

(21) Appl. No.: 17/667,092

(22) Filed: Feb. 8, 2022

(65) Prior Publication Data

US 2022/0157793 A1 May 19, 2022

Related U.S. Application Data

(63) Continuation-in-part of application No. PCT/CN2020/098499, filed on Jun. 28, 2020.

(30) Foreign Application Priority Data

Aug. 13, 2019 (CN) .......................... 201921314132.6
Sep. 18, 2019 (CN) .......................... 201921553485.1
Mar. 30, 2020 (CN) .......................... 202010234735.6

(51) Int. Cl.
*H01L 25/075* (2006.01)
*H01L 33/54* (2010.01)
*H01L 33/62* (2010.01)

(52) U.S. Cl.
CPC .......... *H01L 25/0753* (2013.01); *H01L 33/54* (2013.01); *H01L 33/62* (2013.01)

(58) Field of Classification Search
CPC .......................... H01L 25/0753; H01L 33/62
See application file for complete search history.

(56) References Cited

U.S. PATENT DOCUMENTS

2019/0281672 A1* 9/2019 Yan .................. H05B 45/00
2019/0363332 A1* 11/2019 Fauteux ............ H01M 50/342

FOREIGN PATENT DOCUMENTS

| CN | 109216525 A | 1/2019 |
| CN | 109755374 A | 5/2019 |
| CN | 209015627 U | 6/2019 |

OTHER PUBLICATIONS

Search Report issued to PCT application No. PCT/CN2020/098499 on Sep. 2, 2020.

* cited by examiner

*Primary Examiner* — Karabi Guharay
(74) *Attorney, Agent, or Firm* — Muncy, Geissler, Olds & Lowe, P.C.

(57) ABSTRACT

A light-emitting device includes a number (N) of light-emitting units, a number (a) of first metal pads and a number (b) of second metal pads. Each of the light-emitting units includes a number (n) of light-emitting chips each having two distinct terminals, where N and n are integers and $N>1$, $n \geq 3$. The numbers (a) and (b) are integers and $a>1$, $b>1$, and the terminals of each of the light-emitting chips are electrically connected to a unique combination of one of the number (a) of first metal pads and a number (b) of second (Continued)

metal pads, respectively. The numbers (N), (n), (a) and (b) satisfy the equation: a*b=n*N.

24 Claims, 15 Drawing Sheets

LIGHT-EMITTING DEVICE AND DISPLAY SCREEN INCLUDING THE SAME

CROSS REFERENCE TO RELATED APPLICATIONS

This application is a Continuation-in-Part of co-pending Application No. PCT/CN2020/098499, filed on Jun. 28, 2020, for which priority is claimed under 35 U.S.C. § 120, the entire contents of which are hereby incorporated by reference.

FIELD

The disclosure relates to a light-emitting device, and a display screen that includes the light-emitting device.

BACKGROUND

In the field of display, display screens manufactured using fine pixel pitch (PFF) light-emitting diodes (LED) accounts for an increasing market share. Typically, a PFF-LED display screen refers to a display screen made using an LED array which includes pixels that are closely placed among one another. That is, the pixel pitch (a distance between centers of two adjacent pixels) of a PFF-LED display screen is lower than P2.5 millimeters. The PFF-LED display screen provides a higher resolution, and can be manufactured using improved manufacturing technique.

Using the PFF-LED, the display screen may be made smaller and with a higher resolution, and enable wider applications in various fields such as smartphones, in-vehicle displays, televisions, computers, screens for video conferences, etc. Currently, the display screens are made of packages having a dimension of 2121 (i.e., 21 millimeters in length and width), 1010, or even smaller, such as 0808. It is noted that however, with reduction of the pixel pitch, a density of LED package components on the PFF-LED display screen increases, and since the conventional LED display screens are built using single-chip modules (SCM), manufacturing of the PFF-LED display screen (including packaging light-emitting chips and assembling the packages) would also become more difficult. For example, a typical package component includes three light-emitting chips that emits red light, green light and blue light, respectively, and includes four pins. To mount the package component on a board, four corresponding metal pads are required to be provided on the board. The increased density of the metal pads on the board also increases the difficulty of manufacturing the PFF-LED display screen.

SUMMARY

Therefore, an object of the disclosure is to provide a light-emitting device that is configured to reduce a number of metal pads that are required to be provided on the board, and that is relatively easier to be manufactured.

According to one embodiment of the disclosure, the light-emitting device includes:
- a number (N) of light-emitting units, each of the light-emitting units including a number (n) of light-emitting chips each having a first terminal and a second terminal that have opposite polarities, where N is an integer greater than one, and n is an integer greater than or equal to three;
- a number (a) of first metal pads electrically connected to the first terminals of the light-emitting chips, where a is an integer equal to or greater than one; and
- a number (b) of second metal pads electrically connected to the second terminals of the light-emitting chips, where b is an integer equal to or greater than one,
- wherein each of the light-emitting chips is electrically connected to a unique combination of one of the number (a) of first metal pads and one of the number (b) of second metal pads, and
- wherein the numbers (N), (n), (a) and (b) satisfy an equation of $a*b=n*N$.

Another object of the disclosure is to provide a display screen that is assembled using a plurality of aforementioned light-emitting devices.

Another object of the disclosure is to provide a light-emitting device.

According to one embodiment of the disclosure, the light-emitting device includes:
- a number (N) of light-emitting units that are arranged in an $N_x*N_y$ two-dimensional array, each of the light-emitting units including a number (a) of light-emitting chips each having a first terminal and a second terminal that have opposite polarities and that are disposed at one surface, where N and n are integers and $N \geq 3$, $N_x \geq N_y$;
- an encapsulating layer that surrounds a side surface of each of the light-emitting chips;
- at least one wiring layer that is disposed on the one surface of each of the light-emitting chips; and
- a plurality of metal pads disposed on the wiring layer.

The wiring layer includes electrical wires that connect the light-emitting chips to the metal pads, and the number of metal pads equals to $N_x+N_y*a$.

Another object of the disclosure is to provide a light-emitting device.

According to one embodiment of the disclosure, the light-emitting device includes a number (N) of light-emitting units arranged in an n*n array, where n equals to a square root of (N), also labeled as sqrt (N). Specifically, n is an integer greater than 1, and $1<N\leq64$.

Each of the light-emitting units includes a red light-emitting chip, a blue light-emitting chip and a green light-emitting chip. A distance Dx is defined as a distance between specific corners of two light-emitting chips of the same type, respectively, of the two light-emitting units in the same column. For example, the distance Dx may be a distance between two upper-left corners of two red light-emitting chips of two light-emitting units in the same column. As a result, a length and a width of the light-emitting device may be Dx*n.

The light-emitting device further includes a substrate that includes a plurality of metal pads to be connected to the light-emitting units. In this embodiment, the number of metal pads (P) may be calculated by first rounding up a number 2*sqrt(3N) to obtain a number R, and then determining that $P=R\pm1$.

A number of the metal pads on one side of the substrate along one of the first direction (Y) and the second direction (X) may be between a rounded-up number of sqrt[2*sqrt(3N)] and a rounded-down number of sqrt[2*sqrt(3N)]. A number of the metal pads on another side of the substrate along the other one of the first direction (Y) and the second direction (X) may be a rounded-up number of sqrt[2*sqrt(3N)], and a distance between adjacent two of the metal pads, a length and a width of each of the metal pads are equal to one another (labeled as "Dy"). A resulting length and width of the substrate may be 2*sqrt[2*sqrt(3N)]*Dy, and satisfy the relation of Dx≥{0.2*sqrt[2*sqrt(3N)]}/sqrt(N).

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
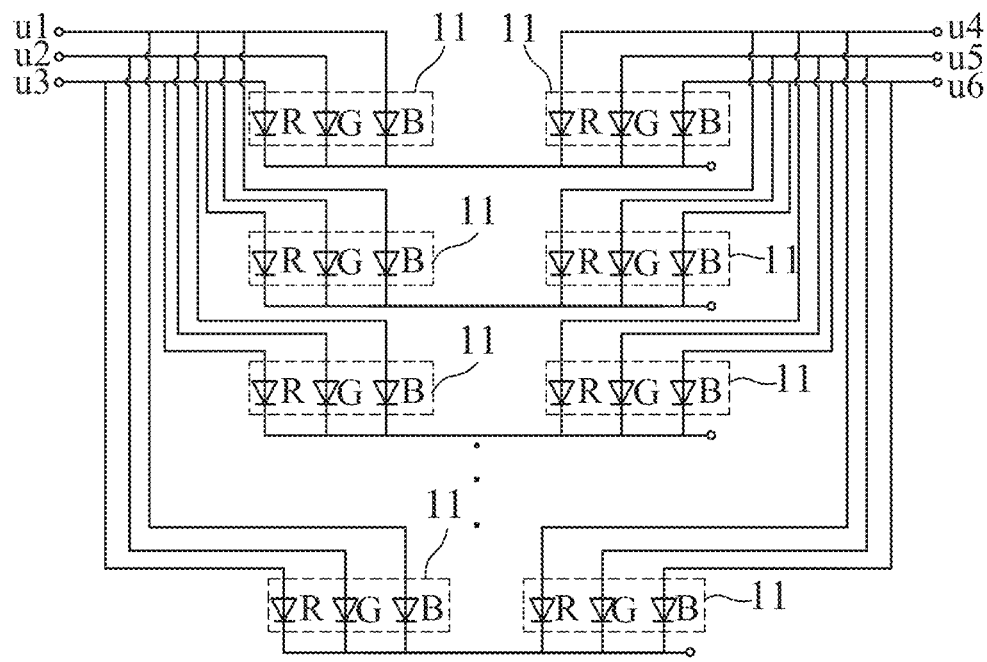
FIG. 1 is a circuit diagram of an exemplary sixteen-in-one light-emitting device according to one embodiment of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics. As a result, when an element has been defined in one of the figures, the same element will not be further defined or described in appearances of subsequent figures.

Throughout the disclosure, the terms such as "first", "second" are only used to distinguish similar elements from one another, and should not be interpreted as an indication or implication of relative importance.

This application provides a light-emitting device. According to one embodiment, the light-emitting device includes a package module that integrates a plurality of light-emitting units. In this embodiment, each of the light-emitting units may be embodied using a package body that includes a plurality of light-emitting chips. For example, each of the light-emitting units may include three light-emitting chips. Specifically, the three light-emitting chips may be a set of red, green, blue (RGB) chips, which includes a red light-emitting chip, a green light-emitting chip and a blue light-emitting chip that are configured to emit red light, green light and blue light, respectively. The light-emitting chip may be embodied using light-emitting diodes (LED).

In some embodiments, a plurality of light-emitting devices may be assembled to manufacture an LED display screen. Using configurations as described below, the LED display screen may be manufactured with improved efficiency related to the use of single-chip modules (SCM). In this embodiment, the light-emitting device may be embodied as an N-in-one device, such as two-in-one, four-in-one, six-in-one, etc. The term "N-in-one" indicates that a number (N) of the light-emitting units are assembled on a single package module. That is to say, an N-in-one light-emitting device includes the number (N) of the light-emitting units.

In some embodiments, the light-emitting device includes the number (N) of light-emitting units, a number (a) of first metal pads, and a number (b) of second metal pads. Specifically, the numbers (a) and (b) are integers equal to or greater than one. The first metal pads and the second metal pads are configured to be connected to appropriate signal sources. For example, the first metal pads are connected to one of a high voltage (e.g., a power supply voltage Vcc) and a low voltage (e.g., a ground reference voltage Vss), and the second metal pads are connected to the other one of the high voltage and the low voltage.

Each of the light-emitting units includes a number (n) of light-emitting chips, each having a first terminal and a second terminal that have opposite polarities. Specifically, N is an integer greater than one, and n is an integer greater than or equal to three (N>1, n≥3). The first terminal may be one of a cathode and an anode of an LED, and the second terminal may be the other one of the cathode and the anode.

In order to operate each of the light-emitting chips (i.e., to be controlled to emit or not emit light), the two terminals are to be connected to one of the first metal pads and one of the second metal pads, respectively. Specifically, the first metal pads are electrically connected to the first terminals of the light-emitting chips, and the second metal pads are electrically connected to the second terminals of the light-emitting chips.

Each of the light-emitting chips is electrically connected to a unique combination of one of the number (a) of first metal pads and one of the number (b) of second metal pads. That is to say, all of the light-emitting chips in the light-emitting device are arranged in a manner that there does not exist two or more separate light-emitting chips with the two distinct terminals being connected to a same combination of one of the number (a) of first metal pads and one of the number (b) of second metal pads. In this manner, each of the light-emitting chips in the light-emitting device may be separately controlled to be activated or cut off.

A relationship of the numbers (N), (n), (a) and (b) satisfy an equation of $a*b=n*N$. In this configuration, a total number (P) of metal pads (i.e., the first metal pads and the second metal pads) used for the light-emitting device may be denoted as a+b, and it is desirable to minimize the number of (a+b). Additionally, (n*N) indicates the total number of the light-emitting chips in the light-emitting device, and (a*b) indicates a number of available unique combinations of "one first metal pad and one second metal pad". It is noted that in order to make all of the light-emitting chips be connected to the appropriate metal pads, (a*b) is to be at least equal to (n*N).

In one example, a four-in-one light-emitting device includes four light-emitting units, and each of the light-emitting units includes three light-emitting chips (e.g., a set of RGB chips). That is to say, N=4, n=3. Conventionally, such light-emitting device needs 4*4=16 metal pads to connect all of the light-emitting chips to the signal sources.

In this example, since (a*b) is exemplified to be 12, and (a) and (b) are integers, possible combinations of (a, b) may be (1, 12), (2, 6), (3, 4), (4, 3), (6, 2) and (12, 1). The possible total number of (a+b) (i.e., the total number of metal pads) may be 12+1=13, 6+2=8, or 4+3=7.

In one example, a two-in-one light-emitting device includes two light-emitting units, and each of the light-emitting units includes three light-emitting chips (e.g., a set of RGB chips). That is to say, N=2, n=3. Conventionally, such light-emitting device needs 2*4=8 metal pads to connect all of the light-emitting chips to the signal sources.

In this example, since (a*b) is exemplified to be 6, and (a) and (b) are integers, possible combinations of (a, b) may be (1, 6), (2, 3), (3, 2) and (6, 1). The possible total number of (a+b) may be 6+1=7, or 3+2=5.

FIG. 1 is a circuit diagram of an exemplary sixteen-in-one light-emitting device according to one embodiment of the disclosure. In this embodiment, the light-emitting device includes sixteen light-emitting units 11, and each of the light-emitting units 11 includes three light-emitting chips (e.g., a set of RGB chips). That is to say, N=16, n=3. Conventionally, such light-emitting device needs 16*4=64 metal pads to connect all of the light-emitting chips to the signal sources.

In the embodiment shown in FIG. 1, since (a*b) is exemplified to be 48, and (a) and (b) are integers, possible combinations of (a, b) may be (1, 48), (2, 24), (3, 16), (4, 12), (6, 8), (8, 6), (12, 4), (16, 3), (24, 2) and (48, 1). The possible total number of (a+b) may be 48+1=49, 24+2=26, 16+3=19, 12+4=16, or 8+6=14.

Since it is desirable to minimize the number of (a+b), using the configuration of eight first metal pads (labeled V1 to V8) and six second metal pads (labeled u1 to u6) would result in the total number of metal pads being fourteen, which is the minimum number among the possible total number of (a+b).

Alternatively, in one embodiment, the number (a) is set to be equal to the number (N); that is to say, the number of the first metal pads is equal to the number of the light-emitting units, and the first metal pads correspond respectively to the light-emitting units.

Each of the light-emitting units includes a common node among the first terminals (or the second terminals) of the light-emitting chips, and the common node is electrically connected to a corresponding one of the first metal pads in a one-to-one connection manner. The common node may be among the anodes of the light-emitting chips, or may be among the cathodes of the light-emitting chips.

For example, a four-in-one light-emitting device includes four light-emitting units and four first metal pads, which respectively correspond to the four light-emitting units, and each of the four light-emitting units has a common node (which may be anode or cathode). The common nodes of the four light-emitting units are to be connected to the four first metal pads (which may be in turn connected to the power supply voltage or the ground reference voltage), respectively.

In this configuration, since a=N, (b) is therefore equal to n. That is to say, the number of the second metal pads is equal to the number of the light-emitting chips included in each of the light-emitting units.

In one example, each of the light-emitting units may include a set of RGB chips, and three second metal pads are present in the light-emitting device. In one exemplary way to connect the other terminal of each of the light-emitting chips (i.e., the one that is not connected to the common node) to the metal pads, the other terminal of each of the red light-emitting chips is connected to a first one of the second metal pads, the other terminal of each of the green light-emitting chips is connected to a second one of the second metal pads, and the other terminal of each of the blue light-emitting chips is connected to a third one of the second metal pads. In this manner, the total number of the metal pads in the four-in-one light-emitting device is seven, which is reduced from sixteen in the conventional configuration.

In some embodiments, each of the light-emitting units may include four light-emitting chips, including a set of RGB chips and a white light-emitting chip that is configured to emit white light. In this configuration, the light-emitting device may include four second metal pads, and the other terminal of each of the white light-emitting chips is connected to a fourth one of the second metal pads. In this manner, the total number of the metal pads is eight, meaning that only one additional metal pad is needed.

In one embodiment, a four-in-one light-emitting device is provided. The four-in-one light-emitting device includes four light-emitting units and four first metal pads. Each of the four light-emitting units has a common node (which may be anode or cathode) among the first terminals of the light-emitting chips, and the common nodes of the four light-emitting units are electrically connected to the first metal pads (which may be in turn connected to the power supply voltage or the ground reference voltage) in a one-to-one connection manner, respectively.

In one alternative embodiment, each of the light-emitting units may include a set of RGB chips, and light-emitting device includes three second metal pads. To connect the other terminal of the light-emitting chips (i.e., the one that is not connected to the common node) to the metal pads, the other terminal of each of the red light-emitting chips is connected to a first one of the second metal pad, the other terminal of each of the green light-emitting chips is connected to a second one of the second metal pad, and the other terminal of each of the blue light-emitting chips is connected to a third one of the second metal pad.

In another alternative embodiment, each of the light-emitting units may further include a white light-emitting chip (i.e., includes four light-emitting chips). In this configuration, four second metal pads may be present in the light-emitting device, and the other terminal of each of the white light-emitting chips is connected to a fourth one of the second metal pads. In this manner, the total number of the metal pads included in the four-in-one light-emitting device can be reduce to as low as seven, which is reduced from sixteen in the conventional configuration, and therefore, reduces the difficulty of packaging the light-emitting device.

Figure 2:
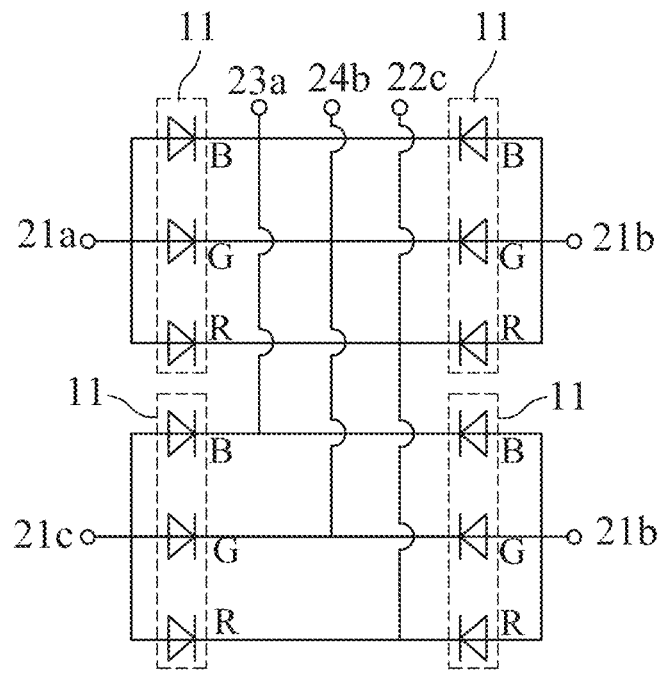
FIG. 2 is a circuit diagram of an exemplary four-in-one light-emitting device according to one embodiment of the disclosure.

FIG. 2 is a circuit diagram illustrating the circuit connection of a four-in-one light-emitting device according to one embodiment of the disclosure. In this embodiment, the four-in-one light-emitting device includes four light-emitting units 11, four first metal pads 21a, 21b, 21c and 21d each connected to the power supply voltage, and three second metal pads 23a, 24b and 22c each connected to the ground reference voltage. The connections between the terminals of the light-emitting chips and the metal pads may be similar to those as described above. For example, each of the light-emitting units 11 has a common node (anode) connected to the corresponding one of the first metal pads 21a, 21b, 21c and 21d, while the cathodes of the blue light-emitting chips are connected to the second metal pad 23a, the cathodes of the green light-emitting chips are connected to the second metal pad 24b, and the cathodes of the red light-emitting chips are connected to the second metal pad 22c.

In one embodiment, a two-in-one light-emitting device is provided. The light-emitting device includes two light-emitting units and two first metal pads. Each of the two light-emitting units has a common node among the first terminals or among the second terminals of the light-emitting chips, and the common nodes of the two light-emitting units are electrically connected to the two first metal pads (which may be in turn connected to the power supply voltage or the ground reference voltage) in a one-to-one connection manner, respectively.

In one alternative embodiment, each of the light-emitting units may include a set of RGB chips, and three second metal pads are present in the light-emitting device. To connect the other terminal of the light-emitting chips (i.e., the terminal that is not connected to the common node) to the metal pads, the other terminal of each of the red light-emitting chips is connected to a first one of the second metal pad, the other terminal of each of the green light-emitting chips is connected to a second one of the second metal pad, and the other terminal of each of the blue light-emitting chips is connected to a third one of the second metal pad. In another alternative embodiment, each of the light-emitting units may further include a white light-emitting chip (i.e., includes four light-emitting chips). In this configuration, four second metal pads may be present, and the other terminal of each of the white light-emitting chips is connected to a fourth one of the second metal pad. In this manner, the total number of the metal pads can be reduce to as low as five, which is reduced from sixteen in the conventional configuration and therefore, reduces the difficulty of packaging the light-emitting device.

Figure 3:
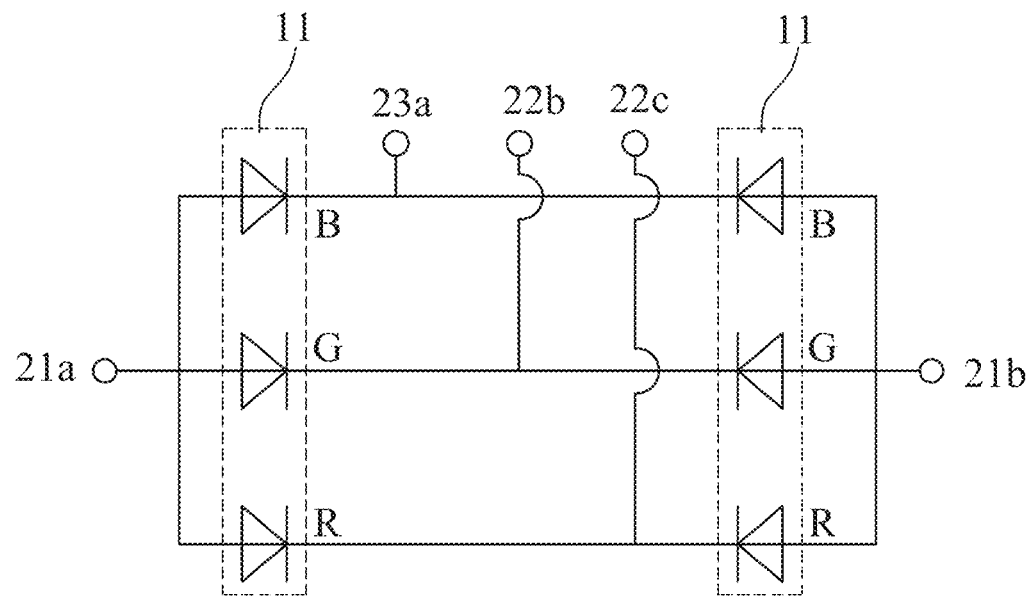
FIG. 3 is a circuit diagram of an exemplary two-in-one light-emitting device according to one embodiment of the disclosure.

FIG. 3 is a circuit diagram illustrating the circuit connection of a two-in-one light-emitting device according to one embodiment of the disclosure. In this embodiment, the two-in-one light-emitting device includes two light-emitting units 11, two first metal pads 21a and 21b each connected to the power supply voltage, and three second metal pads 22a, 22b and 23a each connected to the ground reference voltage. The connections between the terminals of the light-emitting chips and the metal pads may be similar to those as described above. For example, each of the light-emitting units 11 has a common node (anode) connected to the corresponding one of the first metal pads 21a, 21b, while the cathodes of the blue light-emitting chips are connected to the second metal pad 23a, the cathodes of the green light-emitting chips are connected to the second metal pad 22b, and the cathodes of the red light-emitting chips are connected to the second metal pad 22a.

In one embodiment, the number (a) is equal to one, and the equation is simplified as $b=n*N$. In this embodiment, only one first metal pad is present in the light-emitting device, and the number of the second metal pad equals to the total number of the light-emitting chips included in the light-emitting device.

Each of the light-emitting units includes a common node among the first terminals of the light-emitting chips, and the common nodes of all of the light-emitting units are electrically connected to the one first metal pad.

The second terminal of each light-emitting chip of each of the light-emitting units is electrically connected to a respective one of the second metal pads. That is to say, the second terminals of all of the light-emitting chips included in the light-emitting device are connected to the second metal pads, respectively.

In this configuration, a total of $(n*N)+1$ of metal pads are present, while a number $N*(n+1)$ of metal pads are required in the conventional configuration.

In one alternative embodiment, each of the light-emitting units may include a set of RGB chips, and $(3*N)$ of second metal pads and only one first metal pad are present in the light-emitting device. As such, a total of $(3*N)+1$ of metal pads are present. In another alternative embodiment, each of the light-emitting unit may further include a white light-emitting chip (i.e., includes four light-emitting chips). In this configuration, $(4*N)$ second metal pads may be present. As such, a total of $(4*N)+1$ of metal pads are present.

Figure 4:
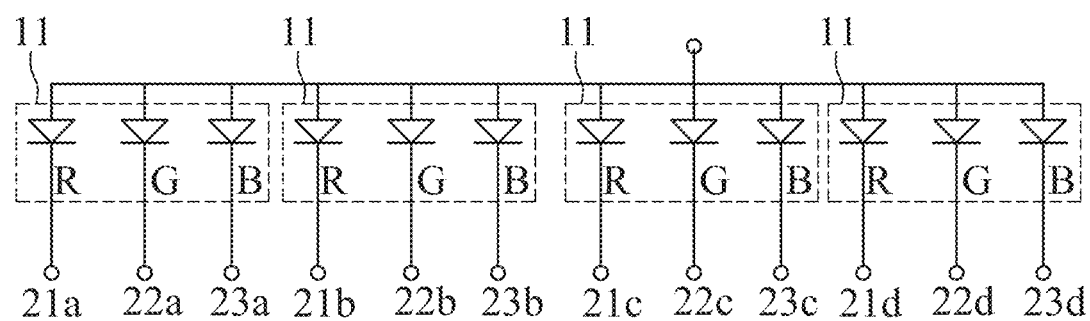
FIG. 4 is a circuit diagram illustrating a circuit connection of a four-in-one light-emitting device according to one embodiment of the disclosure.

FIG. 4 is a circuit diagram illustrating the circuit connection of a four-in-one light-emitting device according to one embodiment of the disclosure. In this embodiment, the four-in-one light-emitting device includes four light-emitting units 11 (each of the light-emitting units 11 includes a set of RGB chips), one first metal pad 24a connected to the power supply voltage, and twelve second metal pads 23d, 22d, 21d, 23c, 22c, 21c, 23b, 22b, 21b, 23a, 22a and 21a each connected to the ground reference voltage. The connections between the terminals of the light-emitting chips and the metal pads may be similar to those as described above. For example, the first terminals (e.g., anode) of the light-emitting chips are all connected to the first metal pad 24a, and the second terminals (e.g., cathode) of the light-emitting chips are connected to the second metal pads 23d, 22d, 21d, 23c, 22c, 21c, 23b, 22b, 21b, 23a, 22a and 21a, respectively.

Figure 5:
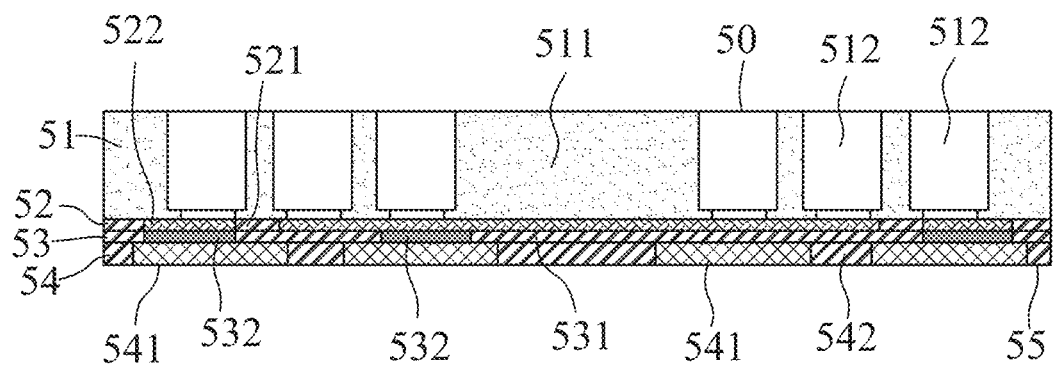
FIG. 5 is a sectional view of a light-emitting device according to one embodiment of the disclosure.

FIG. 5 is a sectional view of a light-emitting device according to one embodiment of the disclosure. In this embodiment, the light-emitting device includes a mask material 511 that cooperatively forms a lighting layer 51 with the light-emitting chips 512 of the light-emitting units. The mask material 511 may be embodied using a black material such as vinyl polymers.

Specifically, a side surface of each of the light-emitting units is surrounded by the mask material 511. The first terminals and the second terminals of the light-emitting chips 512 are located at a bottom surface of the lighting layer 51, and are exposed to be connected to the metal pads 541. In this configuration, a light emitted by the light-emitting chips 512 toward the side surface may be absorbed by the mask material 511, and the resulting display screen may have an improved contrast.

As shown in FIG. 5, the light-emitting device further includes, a first electric circuit layer 52, a via sub-layer 53 and a welding layer 54 that are disposed below the lighting layer 51 in such order. In some embodiments, the light-emitting device may further include a transparent sheet 50 that covers an upper surface of the lighting layer 51. The transparent sheet 50 may be embodied using a PVC layer or other transparent materials so as to allow the light to pass therethrough, and to provide protection to the light-emitting chips 512.

The first electric circuit layer 52 includes a first insulating layer 521 that is in contact with the lighting layer 51, and a wiring section 522 that is embedded in the first insulating layer 521 and that is in contact with the terminals of the light-emitting chips 512.

The via sub-layer 53 includes a second insulating layer 531 that is in contact with the light-emitting layer 521 and that has a number of through holes. The via sub-layer 53 further includes a number of metal wires 532 disposed in the through holes to contact the wiring section 522.

The wiring section 522 is shaped in a manner that a group of the terminals of the light-emitting chips 512 to be connected together to the same one of the metal pads 541 may be electrically connected together using the metal wires 532, and the via sub-layer 53 is shaped in a manner that the metal wires 532 are electrically connected to the corresponding metal pads below. The first insulating layer 521 and the second insulating layer 531 may be embodied using an electrically insulating material, and are disposed to prevent short circuit among the metal wires 532 and the aforesaid components.

The welding layer 54 includes the metal pads 541 (i.e., the abovementioned first metal pads and the second metal pads). The metal pads 541 are disposed to be connected to the metal wires 532.

In some embodiments, the welding layer 54 may further include routing wires (not shown in the figures) that interconnect the wiring section 532 to the metal pads 541 (i.e., the first metal pads or the second metal pads). In this manner, the terminals of the light-emitting chips 512 that are to be connected together to the same one of the metal pads 541 may be alternatively connected together using the routing wires, and then electrically connected to the corresponding metal pads 541.

In some embodiments, the welding layer 54 may further include a third insulating layer 542 that surrounds the metal pads 541 (i.e., the first metal pads and the second metal pads) and the routing wires. The third insulating layer 542 may be embodied using an electrically insulating material, and is disposed to prevent short circuit among the metal pads 541 and the routing wires. The insulating layers 521, 531, 542 may be alternatively embodied using a black electrically insulating material, such that in this configuration, a light emitted by the light-emitting chips 512 toward a side surface of the light-emitting device may be absorbed by the insulating layers, and the resulting display screen may have an improved contrast.

In some embodiments, the light-emitting device may further include an ink layer 55 disposed below the welding layer 54 to cover a bottom surface of the welding layer 54 except the metal pads 541. In this configuration, the ink layer 55 may further help to prevent short circuit among the metal pads 541 and the routing wires.

Figure 6:
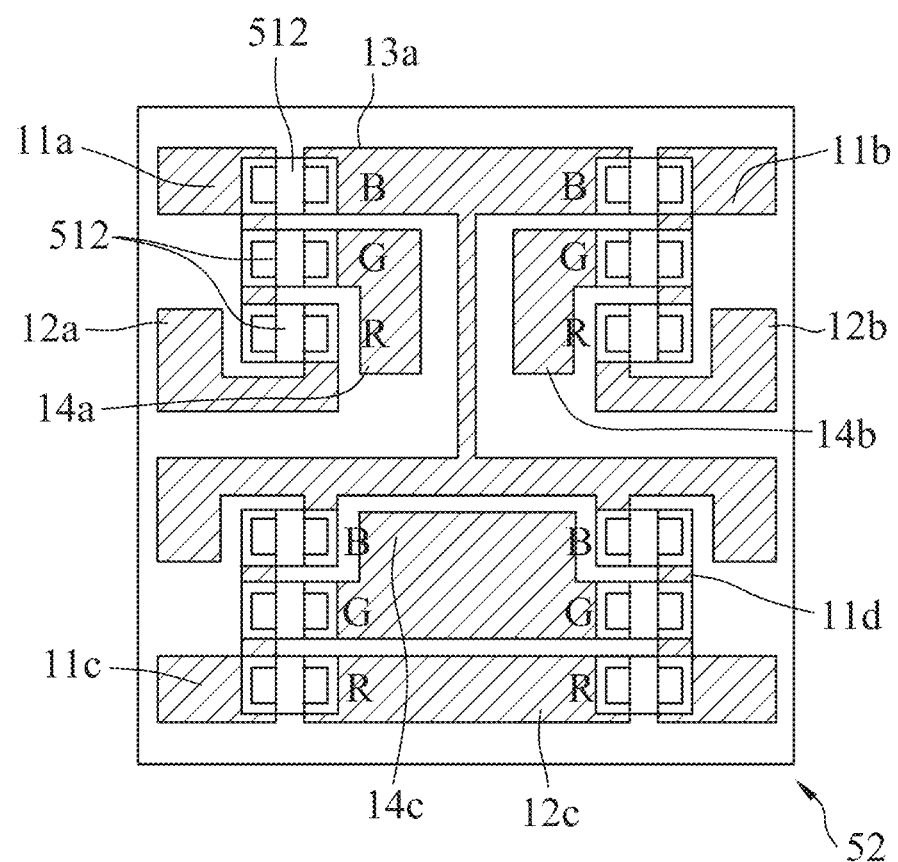
FIG. 6 is a schematic diagram illustrating wiring of an exemplary first electric circuit layer of a light-emitting device according to one embodiment of the disclosure.

FIG. 6 is a schematic diagram illustrating wiring of the first electric circuit layer 52 of the light-emitting device according to one embodiment of the disclosure. In this embodiment, the light-emitting device includes four light-emitting units, and each of the four light-emitting units includes a set of RGB light-emitting chips 512 (further labeled as R, G and B respectively), which amounts to a total of twelve light-emitting chips 512. In this embodiment, the first electric circuit layer 52 includes four common nodes (11a, 11b, 11c and 11d) connected to the terminals (first terminals) of each of the light-emitting chips 512, a metal wire (13a) connected to the other terminals (second terminals) of the four blue light-emitting chips, metal wires (14a, 14b and 14c) connected to the other terminals (second terminals) of the four green light-emitting chips, and metal wires (12a, 12b and 12c) connected to the other terminals (second terminals) of the four red light-emitting chips.

Figure 7:
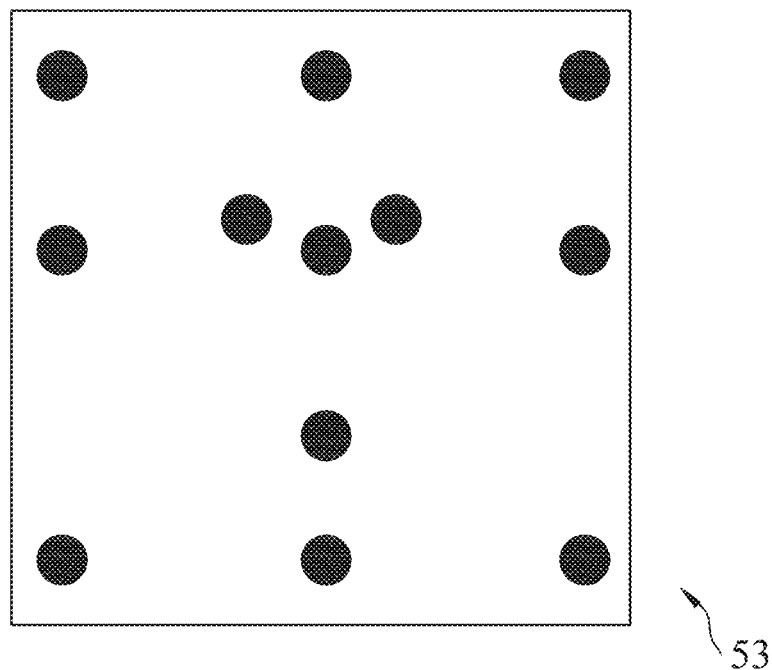
FIG. 7 is a schematic diagram of an exemplary via sub-layer of a light-emitting device according to one embodiment of the disclosure.

FIG. 7 is a schematic diagram of the via sub-layer 53 of the light-emitting device according to one embodiment of the disclosure. The via sub-layer 53 is to be disposed below the first electric circuit layer 52 as shown in FIG. 6. In FIG. 7, each of the black dots represent a through hole filled with the metal wires, and the white portion represents an electrically isolating material.

Figure 8:
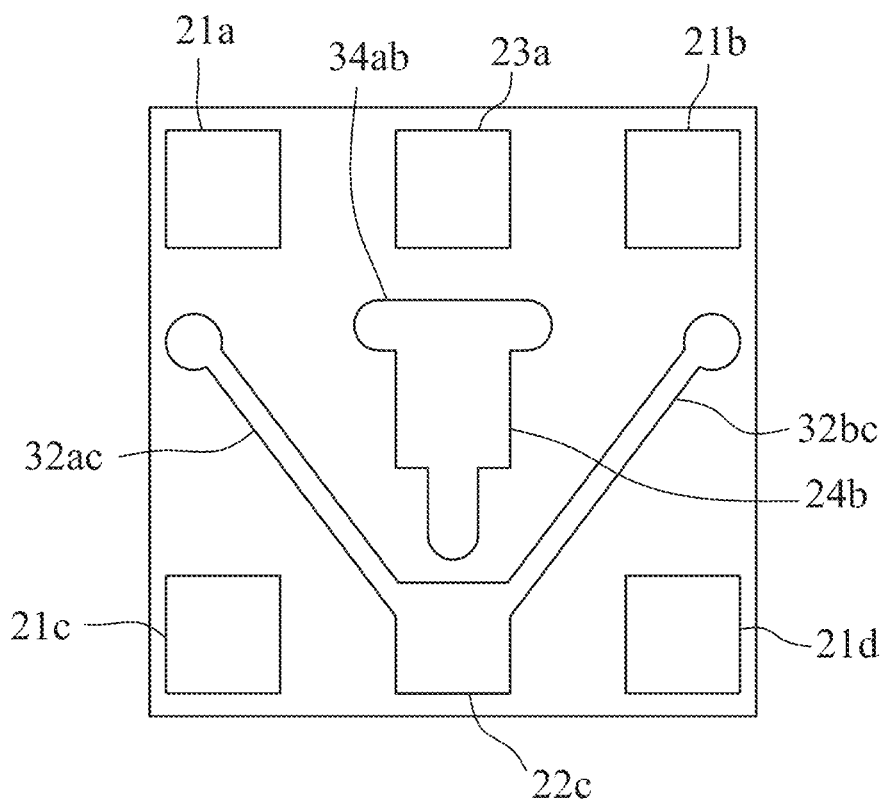
FIG. 8 is a schematic diagram of an exemplary welding layer of a light-emitting device according to one embodiment of the disclosure.

FIG. 8 is a schematic diagram of the welding layer 54 of the light-emitting device according to one embodiment of the disclosure. The welding layer 54 is to be disposed below the via sub-layer 53 as shown in FIG. 7.

As shown in FIG. 8, the welding layer 54 includes seven metal pads (21a, 21b, 21c, 21d, 23a, 24b and 22c). The second terminals of the four green light-emitting chips are connected using the routing wire 34ab to one of the metal pads (24b). The second terminals of the four red light-emitting chips are connected using the routing wires 32ac and 32bc to one of the metal pads (22c). The second terminals of the four blue light-emitting chips are connected together in the first electric circuit layer 52 by the metal wire 13a, and are connected to one of the metal pads (23a). Each of the four common nodes of the first electric circuit layer 52 is also connected to a respective one of the metal pads (21a, 21b, 21c and 21d).

Figure 9:
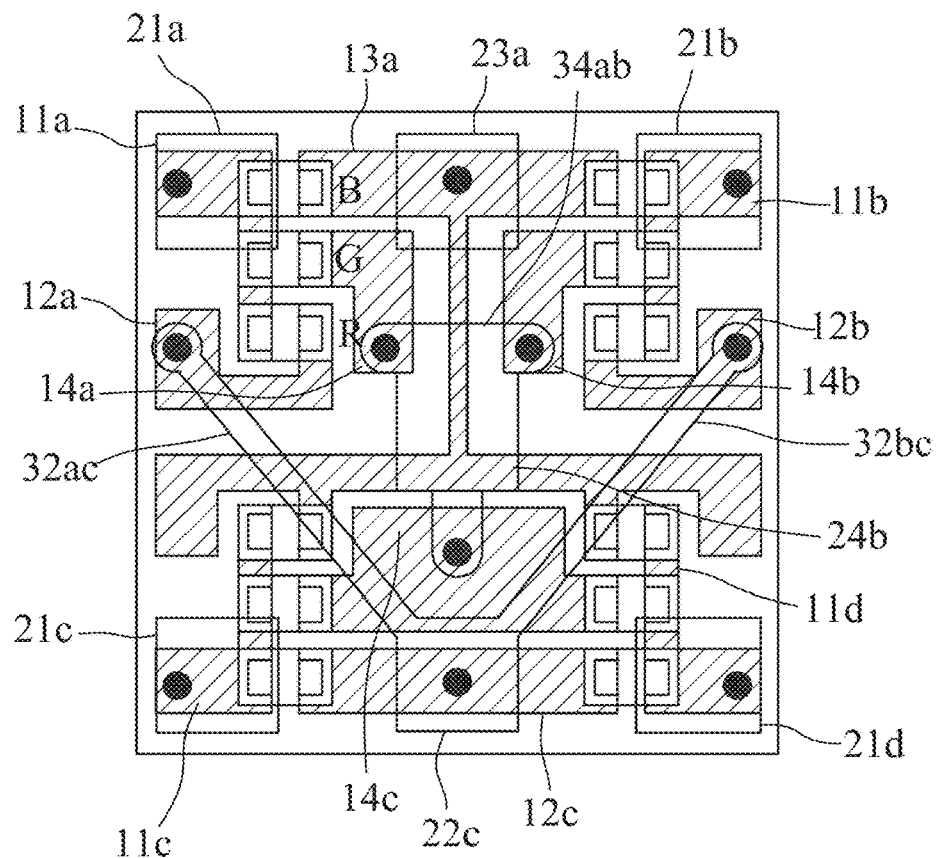
FIG. 9 is a schematic diagram showing the first electric circuit layer, the via sub-layer and the welding layer being disposed together.

FIG. 9 is a schematic diagram showing the first electric circuit layer 52 of FIG. 6, the via sub-layer 53 of FIG. 7 and the welding layer 54 of FIG. 8 being disposed together. As shown in FIG. 9, the four common nodes (11a, 11b, 11c and 11d) included in the first electric circuit layer 52 are respectively connected to the metal pads (21a, 21b, 21c and 21d) in the welding layer 54 through the metal wires in the via sub-layer 53. The second terminals of the four blue light-emitting chips are connected together using the metal wire (13a), and are connected to the metal pad (23a) on the welding layer 54 through the metal wires in the via sub-layer 53. The second terminals of the four green light-emitting chips are connected using the routing wire 34ab through the metal wires (14a, 14b, 14c) in the via sub-layer 53, and are connected to the metal pad (24b) on the welding layer 54. The second terminals of the four red light-emitting chips are connected using the routing wire 34ab through the metal wires (12a, 12b, 12c) in the via sub-layer 53, and are connected to the metal pad (22c) on the welding layer 54 via the routing wires (32ac, 32bc). The wiring among the light-emitting chips and the metal pads of the light-emitting device shown in FIGS. 6 to 9 may be the same as those shown in FIG. 2.

Figure 10:
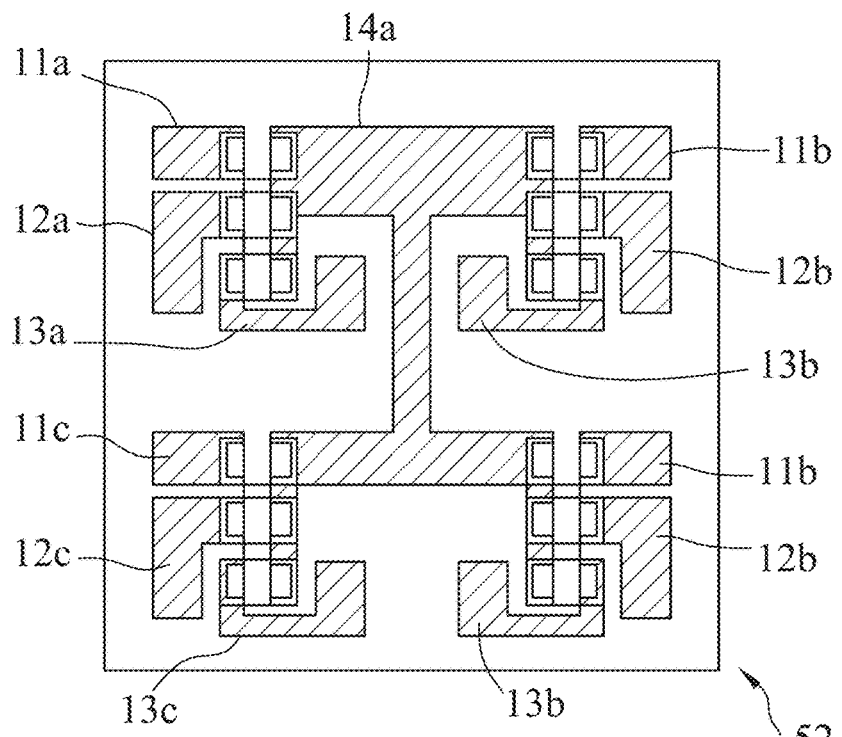
FIG. 10 is a schematic diagram illustrating wiring of an exemplary first electric circuit layer of a light-emitting device according to one embodiment of the disclosure.

FIG. 10 is a schematic diagram illustrating wiring of the first electric circuit layer 52 of the light-emitting device according to one embodiment of the disclosure. In this embodiment, the light-emitting device includes four light-emitting units, and each of the four light-emitting units includes a set of RGB light-emitting chips, which amounts to a total of twelve light-emitting chips. In this embodiment, the first electric circuit layer 52 includes one common node (14a) which is connected to the first terminals of the twelve light-emitting chips (i.e., an anode or a cathode), and twelve metal wires (11a, 12a, 13a, 11b, 12b, 13b, 11c, 12c, 13c, 11d, 12d and 13d) respectively connected to the second terminals of the twelve light-emitting chips.

Figure 11:
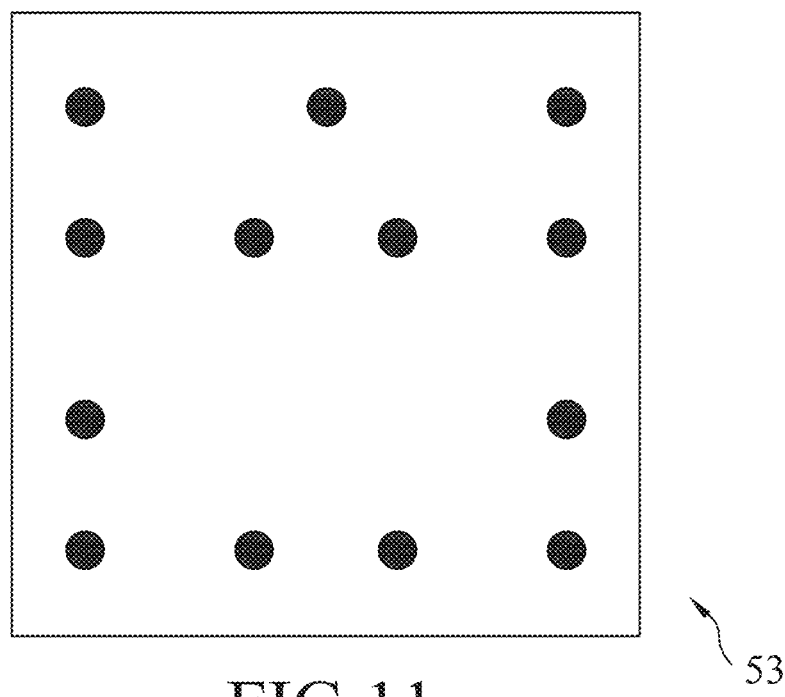
FIG. 11 is a schematic diagram of an exemplary via sub-layer of a light-emitting device according to one embodiment of the disclosure.

FIG. 11 is a schematic diagram of the via sub-layer 53 of the light-emitting device according to one embodiment of the disclosure. The via sub-layer 53 is to be disposed below the first electric circuit layer 52 as shown in FIG. 10. In FIG. 11, each of the black dots represents a through hole filled with the metal wires, and the white portion represents an electrically isolating material.

Figure 12:
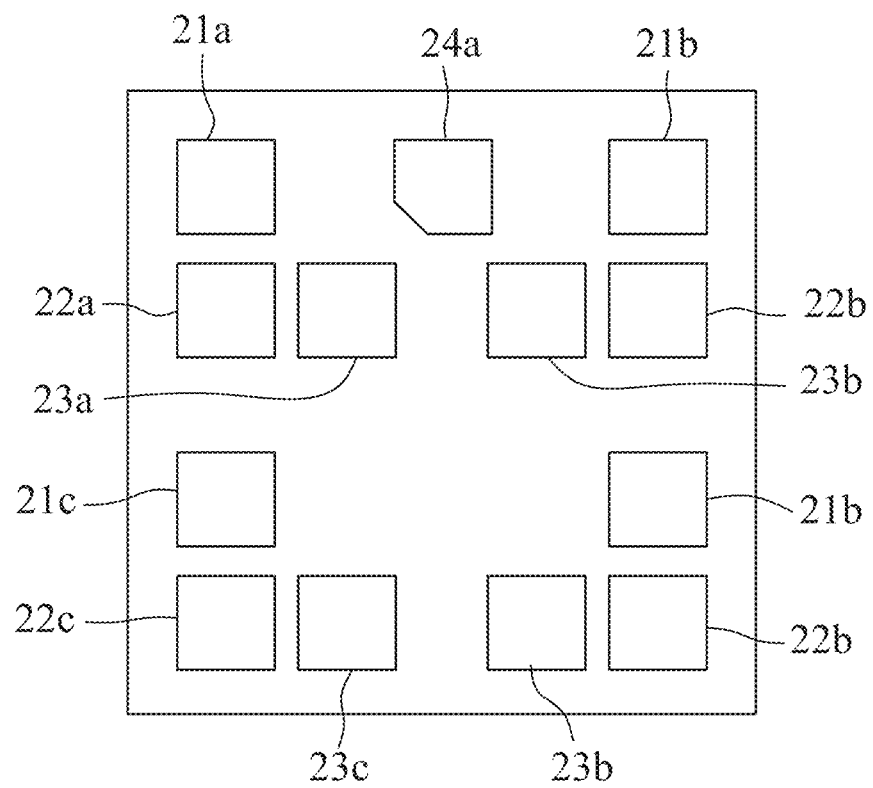
FIG. 12 is a schematic diagram of an exemplary welding layer of a light-emitting device according to one embodiment of the disclosure.

FIG. 12 is a schematic diagram of the welding layer 54 of the light-emitting device according to one embodiment of the disclosure. The welding layer 54 is to be disposed below the via sub-layer 53 as shown in FIG. 11. As shown in FIG. 12, the welding layer 54 includes thirteen metal pads (24a, 21a, 22a, 23a, 21b, 22b, 23b, 21c, 22c, 23c, 21d, 22d and 23d).

Figure 13:
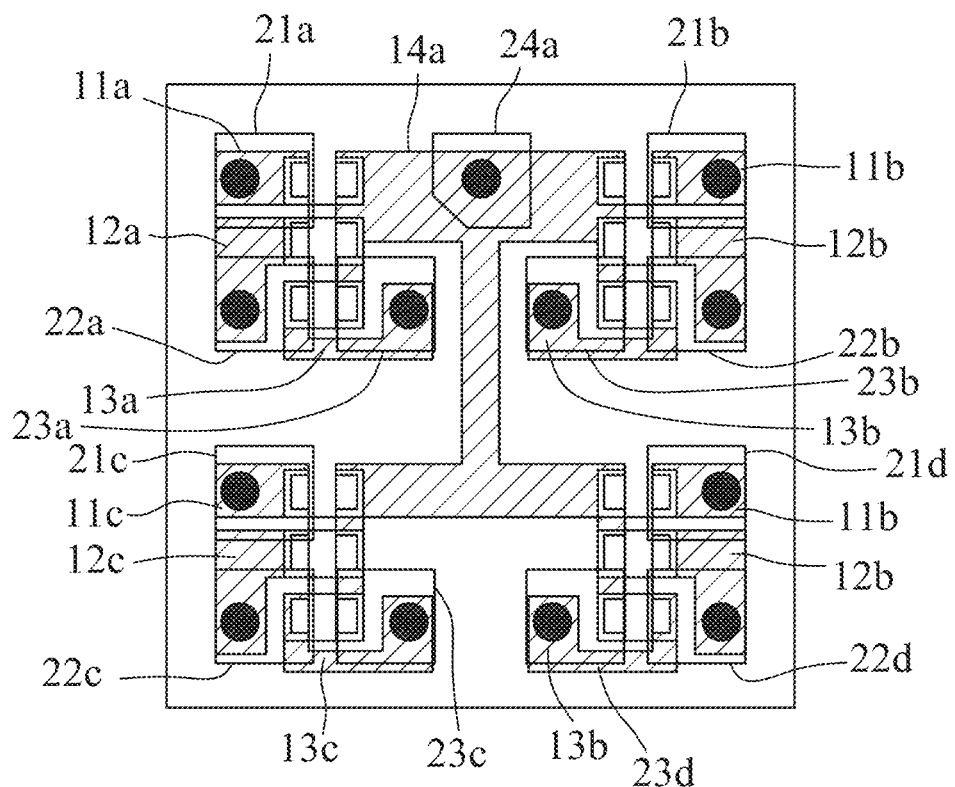
FIG. 13 is a schematic diagram showing the first electric circuit layer, the via sub-layer and the welding layer being disposed together.

FIG. 13 is a schematic diagram showing the first electric circuit layer 52 of FIG. 10, the via sub-layer 53 of FIG. 11 and the welding layer 54 of FIG. 12 being disposed together. As shown in FIG. 13, the common node (14a) included in the first electric circuit layer 52 is connected to the metal pad (24a) on the welding layer 54 through the metal wires in the via sub-layer 53. The second terminals of the twelve light-emitting chips are connected together using the metal wires (11a, 12a, 13a, 11b, 12b, 13b, 11c, 12c, 13c, 11d, 12d and 13d), and are respectively connected to the metal pads (21a, 22a, 23a, 21b, 22b, 23b, 21c, 22c, 23c, 21d, 22d and 23d) on the welding layer 54 through the routing wires in the welding layer 54. The wiring among the light-emitting chips and the metal pads of the light-emitting device as shown in FIGS. 10 to 13 may be the same as those shown in FIG. 4.

Figure 14:
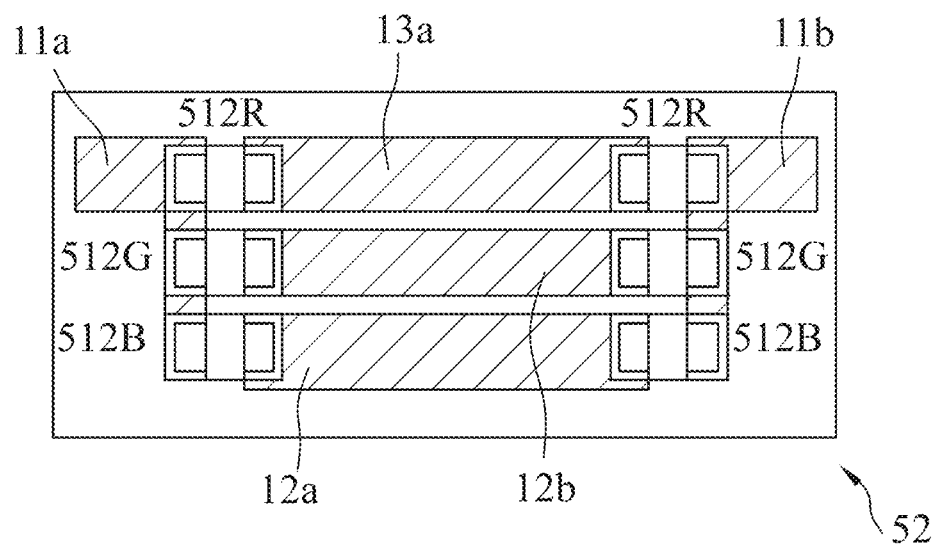
FIG. 14 is a schematic diagram illustrating wiring of an exemplary first electric circuit layer of a light-emitting device according to one embodiment of the disclosure.

FIG. 14 is a schematic diagram illustrating wiring of the first electric circuit layer 52 of the light-emitting device according to one embodiment of the disclosure. In this embodiment, the light-emitting device includes two light-emitting units, and each of the two light-emitting units includes a set of RGB light-emitting chips (labeled as 512R, 512G, 512B), which amounts to a total of six light-emitting chips 512. In this embodiment, the first electric circuit layer 52 includes two common nodes (11a, 11b) each connected to the first terminals of the RGB light-emitting chips (i.e., an anode or a cathode) of a respective one of the light-emitting units, a metal wire (13a) connected to the second terminals of the two blue light-emitting chips, a metal wire (12b) connected to the second terminals of the two green light-emitting chips, and a metal wire (12a) connected to the second terminals of the two red light-emitting chips.

Figure 15:
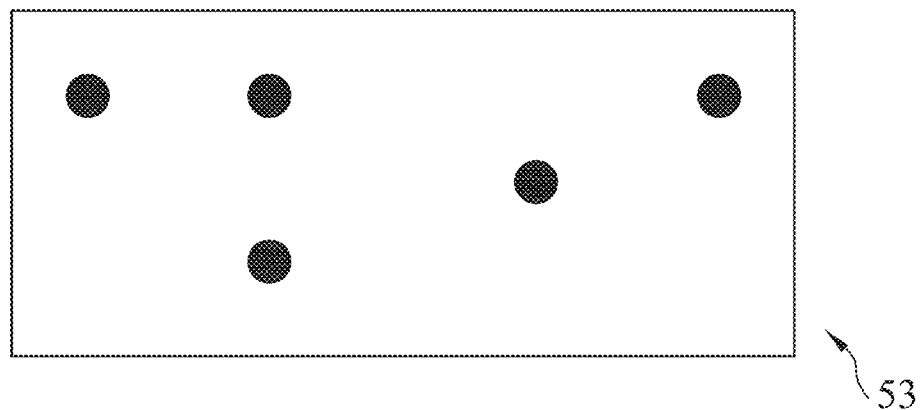
FIG. 15 is a schematic diagram of an exemplary via sub-layer of a light-emitting device according to one embodiment of the disclosure.

FIG. 15 is a schematic diagram of the via sub-layer 53 of a light-emitting device according to one embodiment of the disclosure. The via sub-layer 53 is to be disposed below the first electric circuit layer 52 as shown in FIG. 14. In FIG. 15, each of the black dots represents a through hole filled with the metal wires, and the white portion represent an electrically isolating material.

Figure 16:
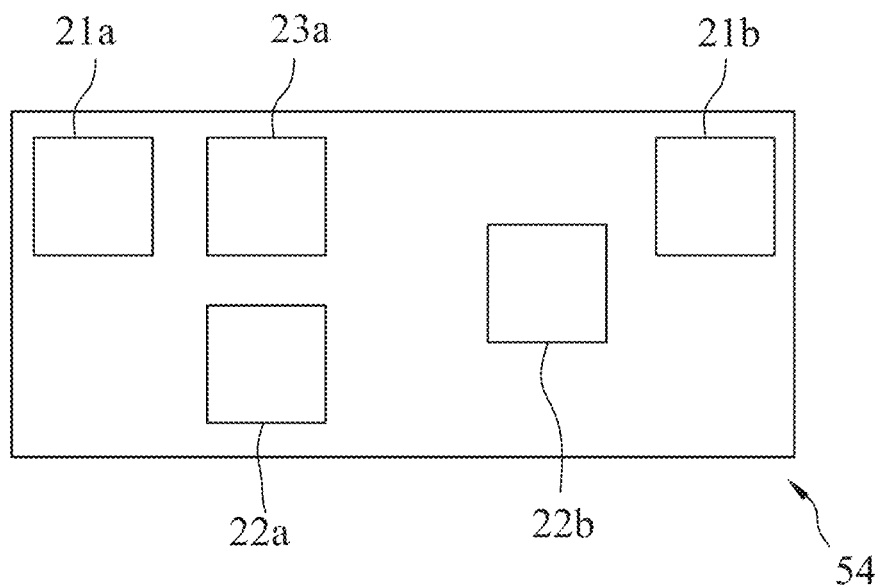
FIG. 16 is a schematic diagram of an exemplary welding layer of a light-emitting device according to one embodiment of the disclosure.

FIG. 16 is a schematic diagram of the welding layer 54 of the light-emitting device according to one embodiment of the disclosure. The welding layer 54 is to be disposed below the via sub-layer 53 as shown in FIG. 15. As shown in FIG. 16, the welding layer 54 includes five metal pads (21a, 23a, 21b, 22b and 22a).

Figure 17:
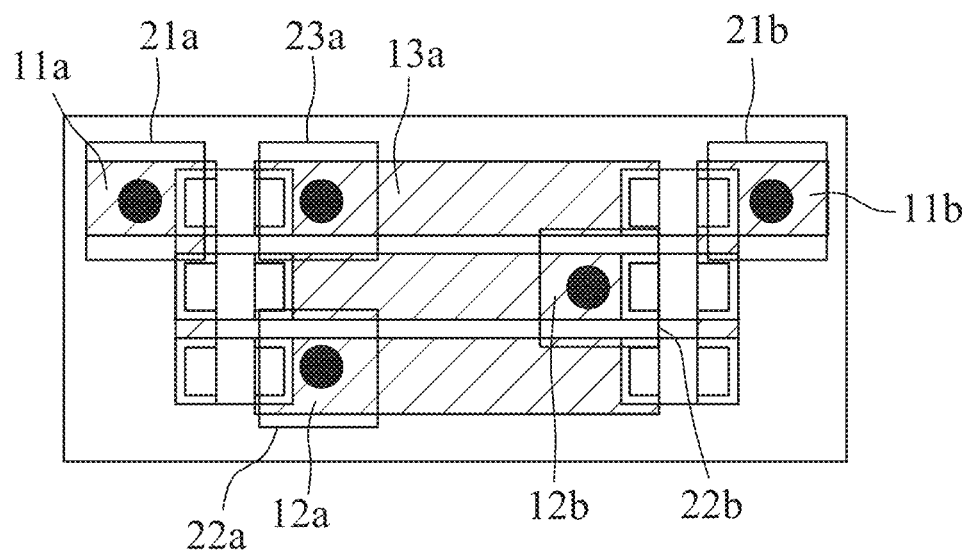
FIG. 17 is a schematic diagram showing the first electric circuit layer, the via sub-layer and the welding layer being disposed together.

FIG. 17 is a schematic diagram showing the first electric circuit layer 52 of FIG. 14, the via sub-layer 53 of FIG. 15 and the welding layer 54 of FIG. 16 being disposed together. As shown in FIG. 17, the common nodes (11a, 11b) included in the first electric circuit layer 52 are connected respectively to the metal pad (21a, 21b) on the welding layer 54 through the routing wires in the welding layer 54. The second terminals of the two blue light-emitting chips are connected together using the metal wire (13a), and are connected to the metal pad (23a) on the welding layer 54 through the metal wires in the via sub-layer 53. The second terminals of the two green light-emitting chips are connected together using the metal wire (12b) in the via sub-layer 53, and are connected to the metal pad (22b) on the welding layer 54 through the metal wire (12b) in the via sub-layer 53. The second terminals of the two red light-emitting chips are connected using the metal wire (12a) through the metal wire (12a) in the via sub-layer 53, and are connected to the metal pad (22b) on the welding layer 54 through the metal wire (12a) in the via sub-layer 53. The wiring among the light-emitting chips and the metal pads of the light-emitting device as shown in FIGS. 14 to 17 may be the same as those shown in FIG. 3.

According to some embodiments, there is provided a display screen that is assembled using a plurality of light-emitting devices as described in the previous embodiments. The resulting display screen may be manufactured with a reduced number of metal pads, and therefore, the manufacturing of the display screen (including packaging light-emitting chips and assembling the packages) may be performed with a reduced difficulty.

According to one embodiment of the disclosure, there is provided an N-in-one light-emitting device. In this embodiment, the N light-emitting units are arranged in an Nx*Ny two-dimensional array, where N≥3, Nx and Ny are integers and Nx≥Ny. Each of the light-emitting units includes a number (a) of light-emitting chips 100, each having a first terminal and a second terminal that have opposite polarities and that are disposed at one surface.

Figure 20:
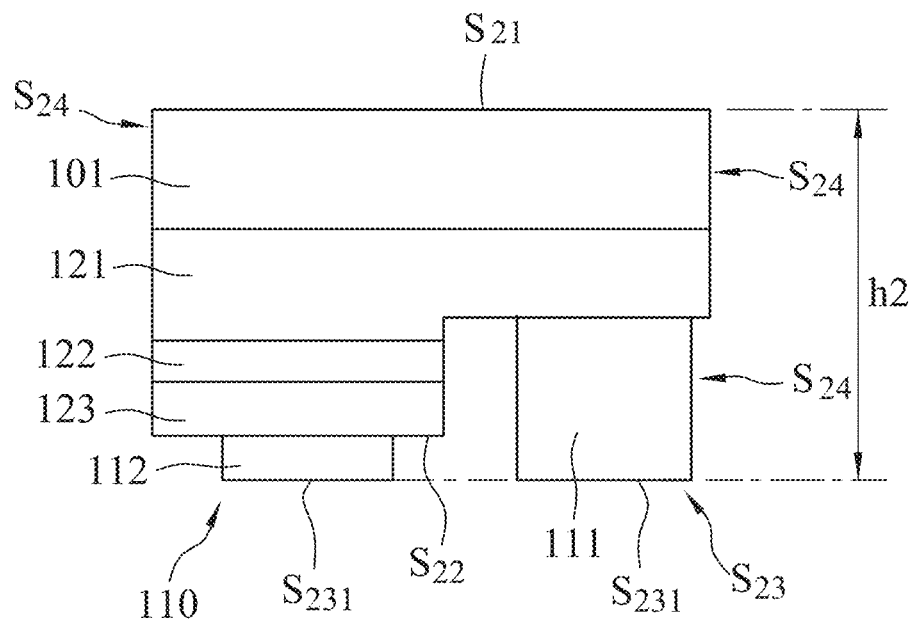
FIG. 20 is a side view of an exemplary light-emitting chip, which is a typical LED chip.

FIG. 20 is a side view of an exemplary light-emitting chip 100, which is a typical LED chip. In some embodiments, the light-emitting device may have a number ($N_x$) of pixels along a horizontal axis, and a number ($N_y$) of pixels along a vertical axis, and thus, the light-emitting units are arranged in an $N_x*N_y$ two-dimensional array. In some embodiments, the number (N) is a multiple of a natural number not greater than 5, the number ($N_x$) is greater than or equal to three, and a ratio of $N_x$ to $N_y$ satisfies $1 \leq N_x/N_y \leq 5$. The abovementioned numbers enables the resulting light-emitting device to be implemented as packages with a minimal number of metal pads, and with dimensions that allow subsequent operations to be performed more conveniently.

Figure 21:
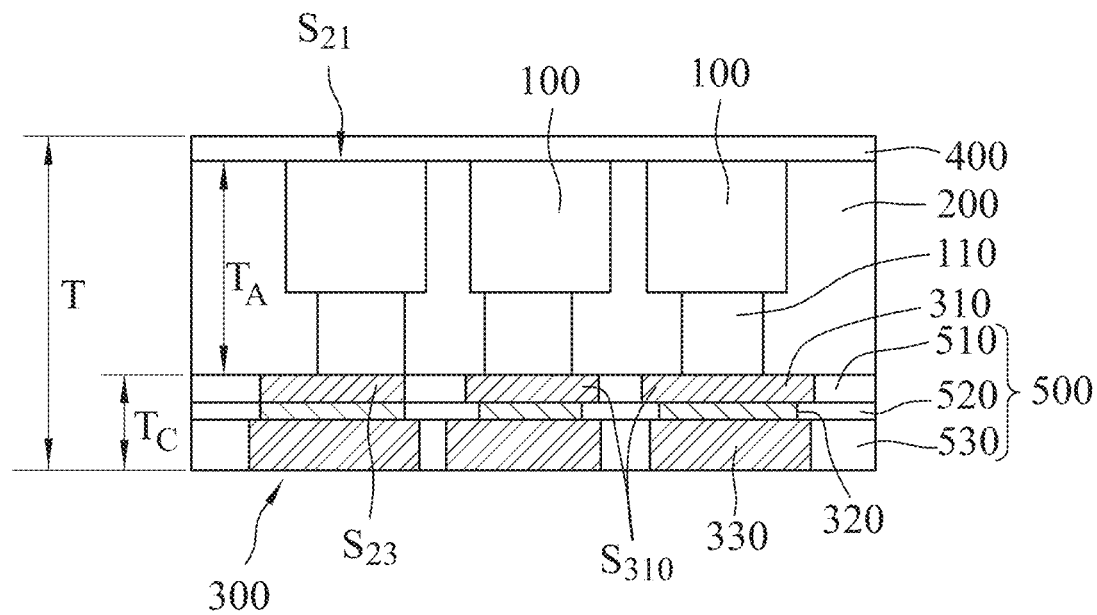
FIG. 21 is a sectional view taken along the line A-A of FIG. 19.

Referring further to FIG. 21, the light-emitting device further includes an encapsulating layer that surrounds a side surface of each of the light-emitting chips, a wiring layer that is formed on said one surface and that is electrically connected to the terminals of each of the light-emitting chips, and a plurality of metal pads disposed on the wiring layer. The wiring layer includes electrical wires that connect the light-emitting chips to the metal pads, so as to form the N-in-one light-emitting device. In this embodiment, the number of metal pads (P) equals Nx+(Ny*a).

Specifically, in certain embodiments, the light-emitting units are arranged in an Nx*Ny two-dimensional array, such that the number (P) has a minimum value. In some embodiments, the number Nx>Ny.

Figure 18:
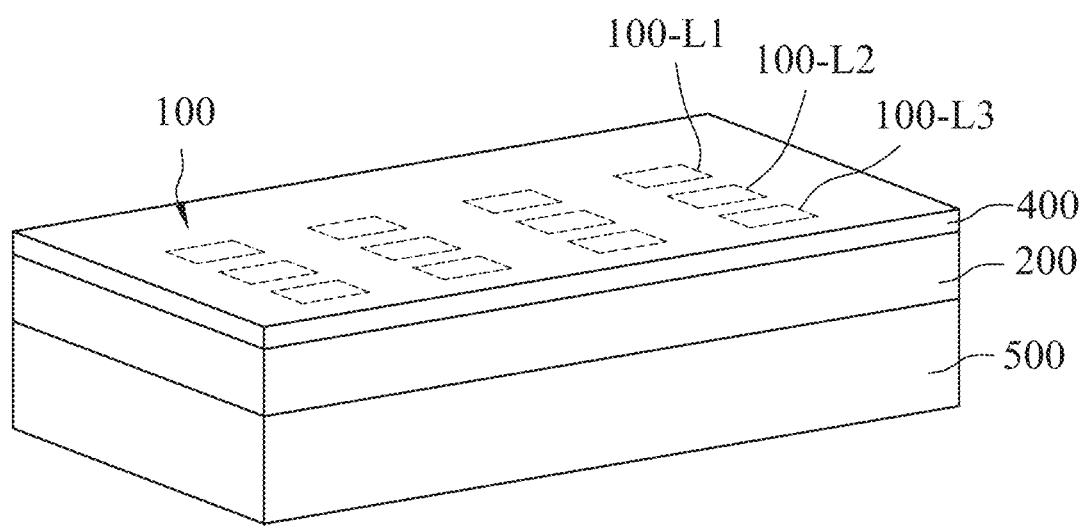
FIGS. 18 and 19 illustrate an exemplary four-in-one light-emitting device according to one embodiment of the disclosure.
Figure 19:
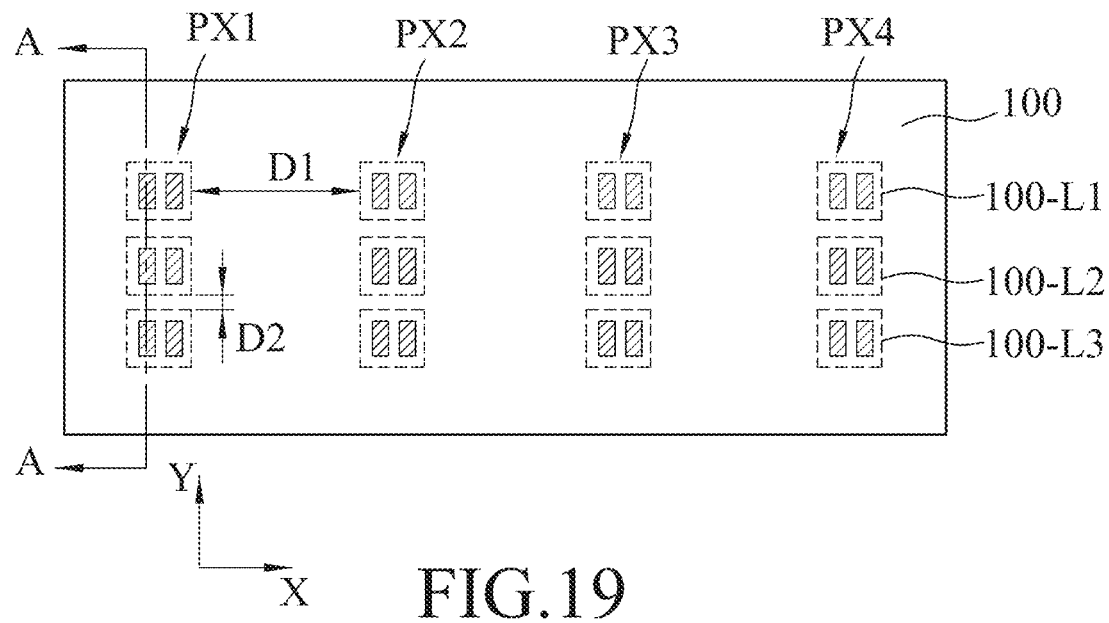

In one embodiment, the number $N=2^{2*k}$, $N_x:N_y=4:1$, and k is a natural number. For example, k may be 1, 2 or 3, and therefore N may be 4, 16 or 64. In such case, (i.e., the ratio of $N_x:N_y$ being 4:1), a number of metal pads needed to implement the light-emitting device may be kept at a minimum. FIGS. 18 and 19 illustrate an exemplary four-in-one light-emitting device according to one embodiment of the disclosure. In this embodiment, each of the light-emitting units includes a set of RBG light-emitting chips (e.g., 100-L1, 100-L2 and 100-L3 shown in FIG. 18). In one alternative embodiment, each of the light-emitting units includes a set of RBGW light-emitting chips (i.e., further includes a white light-emitting chip and a wavelength conversion layer), and the resulting light-emitting device may emit light with an enhanced brightness, which may be useful for outdoor illumination.

The light-emitting units may be respectively referred to as pixels (PX1, PX2, PX3, PX4) in the light-emitting device, as shown in FIG. 19. In the embodiment shown in FIG. 19, for each of the light-emitting units, the light-emitting chips are aligned along a first direction (Y), and the two distinct terminals of each of the light-emitting chips are disposed to be aligned along a second direction (X) perpendicular to the first direction (Y).

FIG. 21 is a sectional view taken along line A-A of FIG. 19, which goes beyond the pixel (PX1) along the first direction (Y).

The pixel (PX1) includes three light-emitting chips 100 that are spaced apart from one another, and each of the light-emitting chips 100 has a light-emitting surface S21 and a set of terminals 110. The pixel (PX1) further includes an encapsulating layer 200 that fills a space among the light-emitting chips 100, and a wiring layer 300 disposed below the encapsulating layer 200. The wiring layer 300 includes a first sub-layer 310 that is disposed below the set of terminals 110 of each of the light-emitting chips 100 to be electrically connected to the terminals 110 in a serial connection and/or a parallel connection, a second sub-layer 330 that includes electrical wirings, and a via sub-layer 320 that is disposed between the first sub-layer 310 and the second sub-layer 330 and that has a number of through holes for allowing electrical connection among the light-emitting chips 100, the first sub-layer 310 and the second sub-layer 330. The pixel (PX1) further includes an electrical insulation layer 500 that fills a space in the wiring layer 300.

It is noted that other pixels (PX2, PX3, PX4) of the light-emitting device may have a same structure as that shown in FIG. 21.

FIG. 20 is a side view of one of the light-emitting chips (e.g., 100) shown in FIG. 21. The light-emitting chip includes a set of terminals 110 (i.e., terminals 111, 112) that are disposed on one side of the light-emitting chips, a substrate 101, a first type semiconductor layer 121, a light-emitting layer 122, and a second type semiconductor layer 123. For example, the first type semiconductor layer 121 includes a p-type semiconductor material, and the second type semiconductor layer 123 includes an n-type semiconductor material. The two terminals 111 and 112 are connected to the first type semiconductor layer 121 and the second type semiconductor layer 123, respectively. A top surface of the substrate 101 serves as a light-emitting surface $S_{21}$, the first type semiconductor layer 121, the light-emitting layer 122, and the second type semiconductor layer 123 form a surface $S_{22}$ that is opposite to the light-emitting surface $S_{21}$, and two sides of the light-emitting chip form two side surfaces $S_{24}$. Each of the set of terminals 110 has a bottom surface $S_{231}$, and the bottom surfaces $S_{231}$ of the set of terminals 110 are coplanar and together define a bottom surface $S_{23}$ of the light-emitting chip that is opposite to the surface $S_{21}$.

In some embodiments, the set of terminals 110 includes two padding layers (not shown). One of the padding layers is disposed between the terminal 111 and the first sub-layer 310, and the other one of the padding layers is disposed between the terminal 112 and the first sub-layer 310. The padding layers may be formed using electro-plating, chemical-plating, printing, or etc., and may include an electrically conductive material such as copper (Cu), $Cu_xW$, etc. By including the padding layers, the set of terminals 110 may be made thicker and a total height (h2) of the light-emitting chip can be increased, thereby increasing an area of contact between the side surfaces S24 and the subsequent encapsulating layer 200, and in turn further secures the light-emitting chip in the encapsulating layer 200. In some embodiments, a thickness of each of the set of terminals 110 may be between 5 μm and 500 μm, such as ranging from 30 to 100 μm, 30 to 50 μm, or 80 to 120 μm. The light-emitting chip may be embodied using a conventional LED chip with a dimension larger than 200 μm, a mini LED chip with a dimension between 100 μm and 200 μm or a micro LED chip with a dimension smaller than 100 μm. In this embodiment, the light-emitting chips are embodied using mini LED chips and micro LED chips.

Referring further to FIG. 21, the encapsulating layer 200 filling the space among the light-emitting chips 100 may include material having a light transmittance less than 30% such as from 5% to 20%. In some embodiments, the encapsulating layer 200 is opaque and non-transparent. The material may be disposed to cover the side surfaces of the light-emitting chips 100, and between the adjacent light-emitting chips 100. Specifically, the material is disposed to fill a space between the light-emitting layers 122 of adjacent light-emitting chips 100. The encapsulating layer 200 may include epoxy or silica rubber, and the material may include black particles such as charcoal particles, or black resin. In this configuration, a light emitted from the side surfaces of the light-emitting chips 100 may be absorbed by the encapsulating layer 200 such that most of the light emitted from the light-emitting chips 100 is focused on the light-emitting surface (i.e., S21), which can reduce the adverse effect resulting from the light emitted from the side surface S24 of one light-emitting chip 100 being mixed with the light emitted from the side surface S24 of another light-emitting chip 100. In one implementation, the encapsulating layer 200 may include black epoxy or silica rubber. In this configuration, a contrast of the resulting display device is increased, in addition to the abovementioned reduction of the adverse effect of light emitted from side surfaces S24 of different light-emitting chips 100. A hardness of the encapsulating layer 200 is greater than a Shore hardness of 60D, and may be greater than a Shore hardness of 85D.

In some embodiments, the light-emitting device may further include a top layer 400 disposed to cover the light-emitting surfaces S21 of the light-emitting chips 100 and the encapsulating layer 200. The top layer 400 may be embodied using a transparent or a translucent material, so as to protect the exposed light-emitting surfaces S21 of the light-emitting chips 100. In some embodiments, the top layer 400 may be a lens configured to cause dispersion, so that the light emitted by a resulting display screen may be less prone to induce dizziness. In some embodiments, the top layer 400 may include a material that can cause dispersion, such as particles. The top layer 400 has a thickness that ranges from 5 μm to 20 μm (such as 10 μm), and may be disposed to protect the exposed light-emitting chips 100 and to reduce the interference among light emitted from different light-emitting chips 100. A light transmittance of the top layer 400 may be greater than 40%. In some cases where the light-emitting device is used for indoor display, the top layer 400 may be translucent, and a light transmittance of the top layer 400 may range from 40% to 80% or 70% to 80%. In this configuration, a brightness of the light-emitting device is reduced, and the light emitted by a resulting display screen may be less prone to induce dizziness. In some cases where the light-emitting device is used for outdoor display, the top layer 400 may be transparent, and a light transmittance of the top layer 400 may be 80%.

In this embodiment, the disposition of the encapsulating layer 200 may be performed by first securing the light-emitting chips 100 on a supporting element such as a tape. That is, the light-emitting surfaces S21 of the light-emitting chips 100 may be used as a surface for a die bonding process, with the surface S23 facing upwardly. Afterward, the material for forming the encapsulating layer 200 is applied to fill the space among the light-emitting chips 100, and then hardened to form the encapsulating layer 200. The supporting element may have a thickness ranging from 5 μm to 20 μm, so as to ensure that the light-emitting chips 100 are firmly secured thereon, and that the light-emitting surfaces S21 of the light-emitting chips 100 are substantially co-planar, with a height difference of less than 10 μm. In this configuration, the light-emitting surfaces S21 of a resulting display screen may be substantially co-planar, such that the adverse effect of interference among light emitted from different light-emitting chips 100 of the display screen which is caused by the light-emitting chips 100 thereof being positioned at different heights, may be reduced.

Referring back to FIG. 19, for each of the pixels (PX1-PX4) in the light-emitting device, the three light-emitting chips of the pixel (PX1-PX4) are arranged along the first direction (Y), while the two terminals of each of the light-emitting chips are arranged along the second direction (X). In this manner, the arrangement of the metal wires for connecting the terminals of the light-emitting chips may be performed more conveniently, and the distance between adjacent light-emitting chips may be reduced. In this embodiment, a distance between adjacent two of the pixels (PX) (labeled as D1 in FIG. 19, and may be referred to as a pixel pitch of the resulting display screen) may be substantially 1 mm, and may be further reduced to, for example, smaller than 0.8 mm (such as, ranging from 0.3 to 0.5 mm or from 0.5 to 0.8 mm). A distance between adjacent two of the light-emitting chips 100 of the same pixel (PX) may be substantially 50 μm, and may be further reduced to, for example, smaller than 50 μm (such as, ranging from 40 to 50 μm, 30 to 40 μm, 20 to 30 μm, or 10 to 20 μm). In such configurations, a total size of the light-emitting device in a package may be reduced, and a resolution of a resulting display screen may be increased. In the case that N equals 16, 64 or other numbers, the distance between adjacent two of the pixels (PX) may be further reduced to below 0.3 mm, such as 0.2 mm or 0.1 mm.

Referring to FIG. 21, the wiring layer 300 is disposed on the surface $S_{23}$ of the light-emitting chips, and includes a first sub-layer 310 electrically connected to set of terminals 110, a via sub-layer 320 connected to the first sub-layer 310, and a second sub-layer 330 that is connected to the first sub-layer 310 through the via sub-layer 320 and that includes electrical wirings.

Each of the sub-layers included in the wiring layer 300 may be embodied using a metal material with a melting point higher than 400° C., such as silver (Ag), copper (Cu), nickel (Ni), aluminum (Al), etc. Each of the sub-layers may be formed using electro-plating, chemical-plating, printing, or etc., and may have a thickness less than 100 μm.

The first sub-layer 310 is formed after formation of the encapsulating layer 200, and is formed on a bottom surface of the encapsulating layer 200 (which may be co-planar with the surface S23) to be electrically connected to the set of terminals 110 of each of the light-emitting chips 100. As seen in FIG. 21, the first sub-layer 310 includes a number of separate sections. Afterward, a first insulating sub-layer 510 is applied to fill the space among the sections of the first sub-layer 310. In some embodiments, the first insulating sub-layer 510 may be embodied using a material that is the same as that of the encapsulating layer 200 (such as colored epoxy or silica rubber, in the case that the light-emitting device is to be used on a display screen). As such, the first insulating sub-layer 510 and the encapsulating layer 200 may be integrated. In other embodiments, the first insulating sub-layer 510 and the encapsulating layer 200 may be embodied using different materials. A hardness of the first insulating sub-layer 510 is configured to be not less than a hardness of the first sub-layer 310. For example, the hardness of the first insulating sub-layer 510 is greater than a Shore hardness of 60D, and may be greater than a Shore hardness of 85D. In this manner, after the first insulating sub-layer 510 is formed, a surface S310 of the first sub-layer 310 may be exposed using surface polishing.

Figure 22:
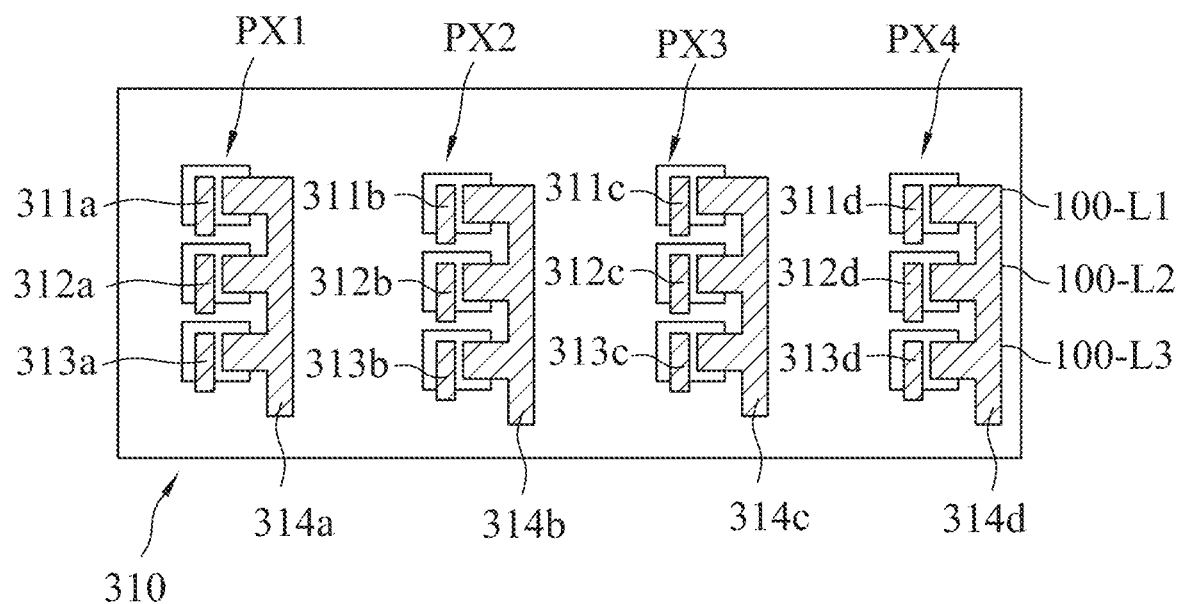
FIGS. 22 to 24 are schematic diagrams of an exemplary first sub-layer, an exemplary via sub-layer, and an exemplary second sub-layer, respectively, according to one embodiment of the disclosure.
Figure 23:
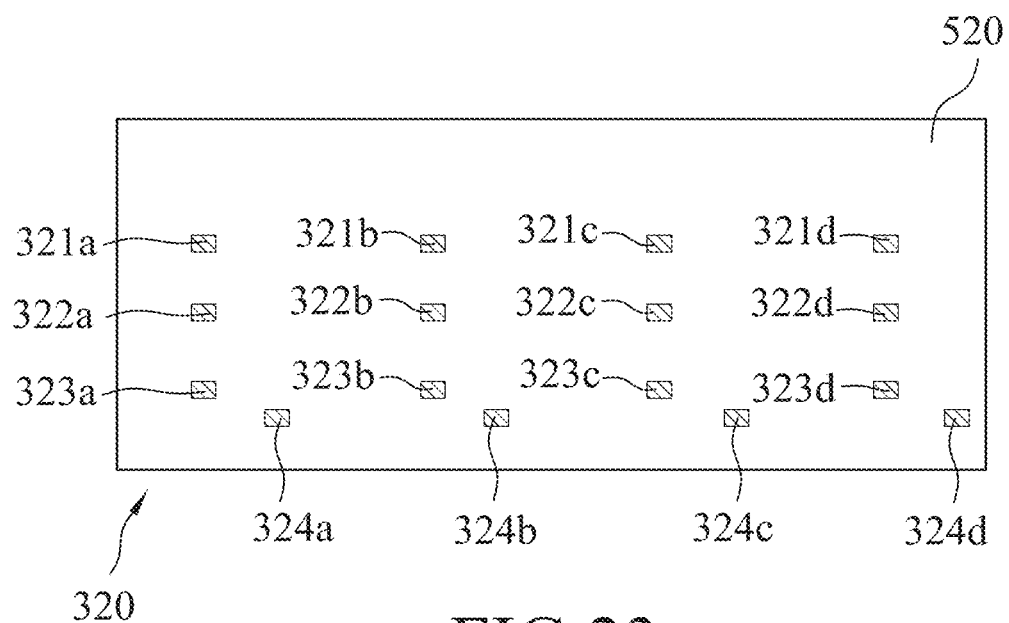
Figure 24:
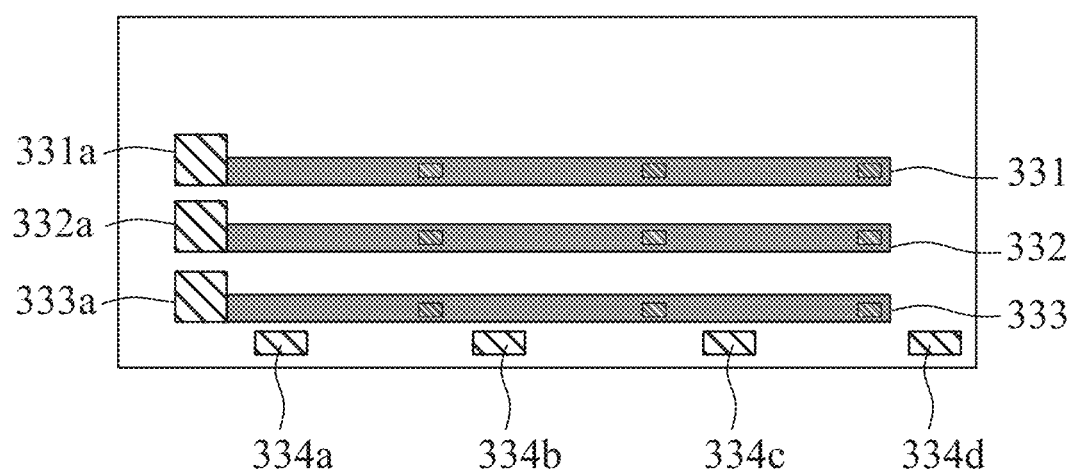

FIGS. 22 to 24 are schematic diagrams of an exemplary first sub-layer 310, an exemplary via sub-layer 320, and an exemplary second sub-layer 330, respectively, according to one embodiment of the disclosure. The exemplary first sub-layer 310, the exemplary via sub-layer 320, and the exemplary second sub-layer 330 are configured to form the wiring layer 300 as described above.

As shown in FIG. 22, the first sub-layer 310 includes four second metal wire patterns 314a, 314b, 314c and 314d, and four sets of first metal wire patterns (311a to 311c, 312a to 312c, 313a to 313c, and 314a to 314c) respectively corresponding to the four pixels (PX). Each of the second metal wire patterns (for example, 314a) includes metal wires electrically connected to the first terminals of the light-emitting chips 100 included in the pixel (PX1) in series. Each of the first metal wire patterns (for example, 311a to 311c) includes three metal wires electrically connected to the second terminals of the light-emitting chips 100 included in the pixel (PX1).

As shown in FIG. 23, the via sub-layer 320 is formed using a second insulating sub-layer 520. The second insulating sub-layer 520 has four sets of through holes (321a to 324a, 321b to 324b, 321c to 324c, and 321d to 324d) formed thereon, allowing the four second metal wire patterns and the four sets of first metal wire patterns to pass therethrough, respectively. An electrical conducting material may be formed on an edge of each of the through holes. It is noted that the second insulating sub-layer 520 may be formed using one of the materials that can be used to form the first insulating sub-layer 510.

A thickness of the sub-layer 320 may be less than 100 µm. In some embodiments, the light-emitting device is to be made with a relatively small thickness, and the thickness of the sub-layer 320 may range from 25 µm to 50 µm, for example, from 25 µm to 30 µm. It is noted that with the increased thickness of the sub-layer 320, an associated stress and a thermal resistance would become greater. As such, without compromising a robustness of the structure of the light-emitting device, it may be beneficial to reduce the thickness of the sub-layer 320. In some embodiments, the thickness of the sub-layer 320 may range from 50 µm to 80 µm, for example, 60 µm. In such case, the light-emitting device having a slightly greater thickness may be easier to pick up from a substrate.

As shown in FIG. 24, the second sub-layer 330 includes metal wires 331 to 333, and connecting pads 331a to 333a, and 334a to 334d. Each of the metal wires 331 to 333 is connected to the second terminals of the light-emitting chips 100 disposed on a same row (i.e., the light-emitting chips 100 that emit light of a same wavelength, and that are from different pixels), respectively.

The connecting pads disposed on the second sub-layer 330 may be embodied using metal pads that are to be connected to appropriate signal sources, that is, one of a high voltage (e.g., a power supply voltage Vcc) and a low voltage (e.g., a ground reference voltage Vss), respectively. In some embodiments, the connecting pads (i.e., may be welding pads) are formed on the second sub-layer 330, followed by forming an electrically insulating material (such as a black ink, an epoxy resin, etc.) on some portions of the second sub-layer 330 not covered by the welding pads, so as to protect the metal wires 331 to 333.

Afterward, a third insulating sub-layer 530 is applied to fill the space among the metal wires 331 to 333. It is noted that the third insulating sub-layer 530 may be formed using one of the materials that can be used to form the first insulating sub-layer 510, and the first insulating sub-layer 510, the second insulating sub-layer 520 and the third insulating sub-layer 530 cooperatively form the electrical insulation layer 500. A surface of the second sub-layer 330 facing away from the light-emitting chips 100 may be then exposed using surface polishing.

In some embodiments, the connecting pads of the second sub-layer 330 are formed to completely cover the through holes on the via sub-layer 320, thereby allowing the second sub-layer 330 to have a larger area of contact with the through holes. In addition, in manufacturing the light-emitting device, the steps of forming the electrical conductive material on the through holes of the via sub-layer 320 and forming the connecting pads may be performed in a same operation. As such, the light-emitting device may be manufactured with higher efficiency.

Each of the first insulating sub-layer 510, the second insulating sub-layer 520 and the third insulating sub-layer 530 may be embodied using the same material or different materials. Some exemplary materials include epoxy resin, silica rubber, polyimide (PI), benzocyclobutene, (BCB), etc. In the case that the first insulating sub-layer 510, the second insulating sub-layer 520 and the third insulating sub-layer 530 are formed using the same material, the resulting electrical insulation layer 500 may be integrally formed and the sub-layers become indistinguishable from one another. In some embodiments, the first insulating sub-layer 510, the second insulating sub-layer 520 and the third insulating sub-layer 530 may be formed using a material that is opaque or with a low light transmittance, such as epoxy resin or silica rubber with black colorant, so as to prevent light emitting from the wiring layer 300.

In one exemplary way of manufacturing the electrical insulation layer 500, the metal wire patterns may first be formed on the wiring layer 300, followed by applying a material for forming the electrical insulation layer 500 to cover the metal wire patterns. Then, the metal wire patterns may be exposed using surface polishing.

In some embodiments, the encapsulating layer 200 is formed with a material that is opaque or with a low light transmittance, and the electrical insulation layer 500 may be formed using a material with a relatively higher light transmittance (e.g., the abovementioned materials without black colorant or other light-absorbing particles). Specifically, particles with a diameter greater than 1 µm may be excluded as the material for forming the electrical insulation layer 500, such that the stability of the electrical insulation layer 500 covering the metal wire patterns may be enhanced. In some embodiment, a light-absorbing material is used to form the encapsulating layer 200, and a light-sensitive material is applied and hardened to form the electrical insulation layer 500. In such configuration, the manufacturing process is simplified and the effect of light emitting from the side surfaces S24 may be reduced.

Figure 25:
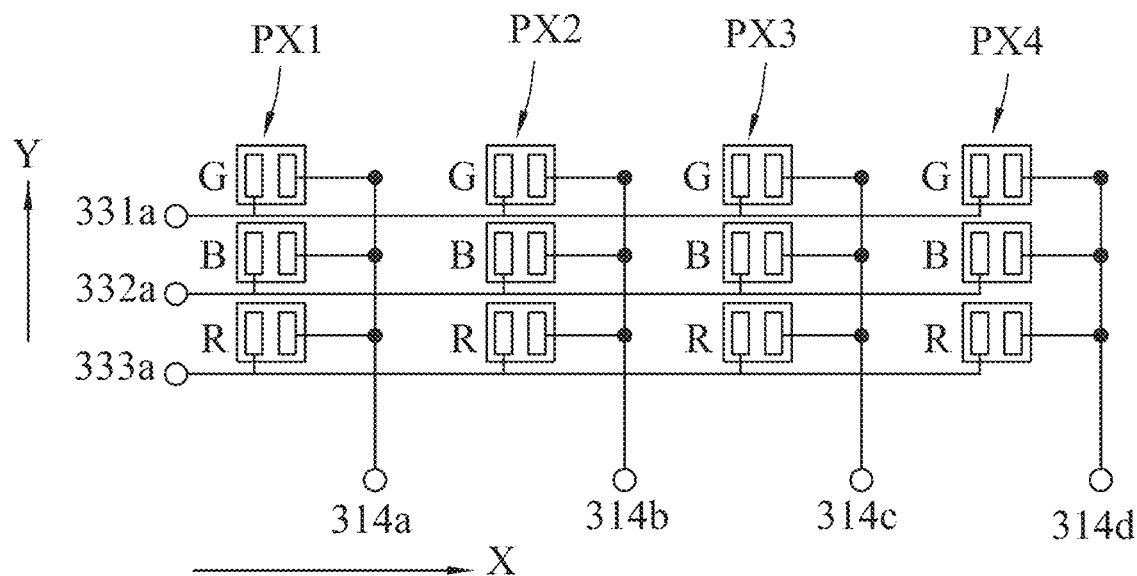
FIG. 25 is a schematic diagram illustrating an exemplary electrical connections among the light emitting units of a light-emitting device, according to one embodiment of the disclosure.

FIG. 25 is a schematic diagram illustrating an exemplary electrical connections among the light emitting units of the light emitting device, according to one embodiment of the disclosure. In this embodiment, for each of the light-emitting units (also known as a pixel (PX)), the light-emitting chips are aligned along the first direction (Y), and the two distinct terminals (first terminal and second terminal) of each of the light-emitting chips are disposed to be aligned along the second direction (X) perpendicular to the first direction (Y).

In this embodiment, the wiring layer 300 (not shown in FIG. 25) may be configured to include a number ($N_x$) of first metal wire patterns that extend along the first direction (Y), and a number ($N_y$*a) of second metal wire patterns that extend along the second direction (X), where $N_x$=4, $N_y$=1 and a=3. The first metal wire patterns correspond respectively to four columns of the light-emitting chips (i.e., four light-emitting units), and each of the first metal wire patterns is electrically connected to the second terminals of the light-emitting chips of the corresponding one of the light-emitting units. The second metal wire patterns respectively correspond to three rows of the light-emitting chips that are aligned along the second direction (X), and each of the second metal wire patterns is electrically connected to the first terminals of the light-emitting chips in the corresponding one of the rows.

In one example shown in FIG. 22, four sets of first metal wire patterns (311a to 311c, 312a to 312c, 313a to 313c, and 314a to 314c) are present. For example, the first metal wire patterns 311a, 311b, 311c and 311d extend along the first direction (Y), and are respectively connected to the first terminals of the light-emitting chips in a top row. Subsequently, the first metal wire patterns 311a, 311b, 311c and 311d are electrically connected to the metal wire 331, and in turn is electrically connected to the connecting pad 331a. It is noted that connections regarding other first metal wire patterns are similar to those described above, and details thereof are omitted herein for the sake of brevity.

In one example as shown in FIG. 22, four second metal wire patterns 314a to 314d are present, and correspond to the light-emitting units (pixels), respectively. For example, the second metal wire pattern 314a includes wirings that extend along the second direction (X), and is electrically connected to the second terminals of the light-emitting chips of the corresponding light-emitting unit (expressed as the pixel (PX1)). It is noted that connections regarding other second metal wire patterns are similar to those described above, and details thereof are omitted herein for the sake of brevity.

Using the configuration shown in FIGS. 22 to 25, the terminals of the light-emitting chips may be connected to form an N-in-one light-emitting device. In this embodiment, the ratio Nx/Ny=4:1, and the resulting dimensions of the light-emitting device make the subsequent assembly of the applications (such as a display screen) easier. Also, the configuration of the electrical connections reduces the number of metal pads needed to a minimum.

In this embodiment, the number N equals 4. In some embodiment, the number N may be 16, 64, etc., and in the case that N equals 16, using the abovementioned ratio yields Nx=8, Ny=2. The arrangement of the aforesaid components in the 16-in-one light-emitting device may be similar to that shown in FIG. 19.

Referring back to FIG. 21, one effect of the abovementioned embodiments is that the resulting light-emitting device would not require a substrate and/or a supporting frame for supporting the light-emitting units thereof because the encapsulating layer 200, the wiring layer 300, the top layer 400 and the electrical insulation layer 500 are configured to cooperatively secure and support the light-emitting units. A thickness of the light-emitting device (T) is mostly attributed to a thickness of the light-emitting chips 100 ($T_A$) and a thickness of the electrical insulation layer 500 ($T_c$).

In the embodiments which use mimi-LEDs, the thickness of the light-emitting chips 100 ($T_A$) may range from 40 μm to 150 μm, the thickness of the electrical insulation layer 500 ($T_c$) may range from 20 μm to 200 μm, or 50 μm to 150 μm. A ratio of T and $T_A$ may be between 1.4 and 10, such that the associated stress and a thermal resistance are reduced. As such, without compromising a robustness of the structure of the light-emitting device, the thickness of the light-emitting device (T) is reduced. In one embodiment, the thickness of the light-emitting chips 100 ($T_A$) may be 80 μm, and the thickness of the light-emitting device (T) may be range from 120 μm to 500 μm, such as 120 μm to 200 μm. Each of the sub-layers of the wiring layer 300 may then have a thickness ranging from 20 μm to 50 μm, such as 30 μm.

In another embodiment, other dimensions of the light-emitting device may be relatively smaller (e.g., each of a width and a length is not greater than 0.4*0.4 mm), which may make the light-emitting device difficult to be picked up from above. As a result, the thickness of the light-emitting device (T) may be slightly increased to enlarge an area of the side surfaces of the light-emitting device. For example, the thickness of the light-emitting device (T) may range from 320 μm to 500 μm such as from 340 μm to 360 μm. The increase of the thickness of the light-emitting device (T) may be attributed to both the thickness of the light-emitting chips 100 ($T_A$) and the thickness of the electrical insulation layer 500 ($T_c$). For example, a thickness of the first sub-layer 310 and the second sub-layer 330 may range from 50 μm to 100 μm, and a thickness of the via sub-layer 320 may range from 30 μm to 80 μm.

In the embodiments which use micro-LEDs, the thickness of the light-emitting chips 100 ($T_A$) may range from 5 μm to 10 μm, the thickness of the electrical insulation layer 500 ($T_c$) may range from 20 μm to 200 μm, or from 50 μm to 150 μm. A ratio of T to $T_A$ may be between 10 and 60. As such, the thickness of the light-emitting device (T) may range from 50 μm 100 μm or 100 μm to 200 μm.

Figure 26:
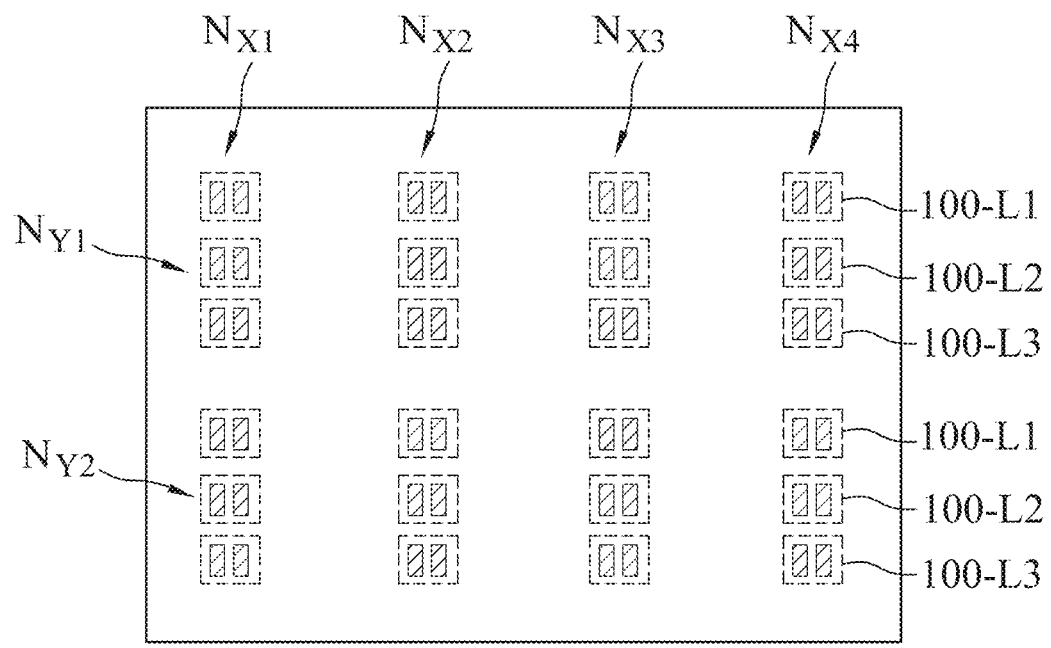
FIG. 26 illustrates a light-emitting device according to one embodiment of the disclosure.

FIG. 26 illustrates a light-emitting device according to one embodiment of the disclosure. In this embodiment, eight light-emitting units are present, and are arranged in a 4*2 array. That is to say, the light-emitting units are arranged in four columns ($N_{X1}$ to $N_{X4}$) and two rows ($N_{Y1}$ to $N_{Y4}$). Each of the light-emitting units includes three light-emitting chips (labeled as 100L1-100L3).

Figure 27:
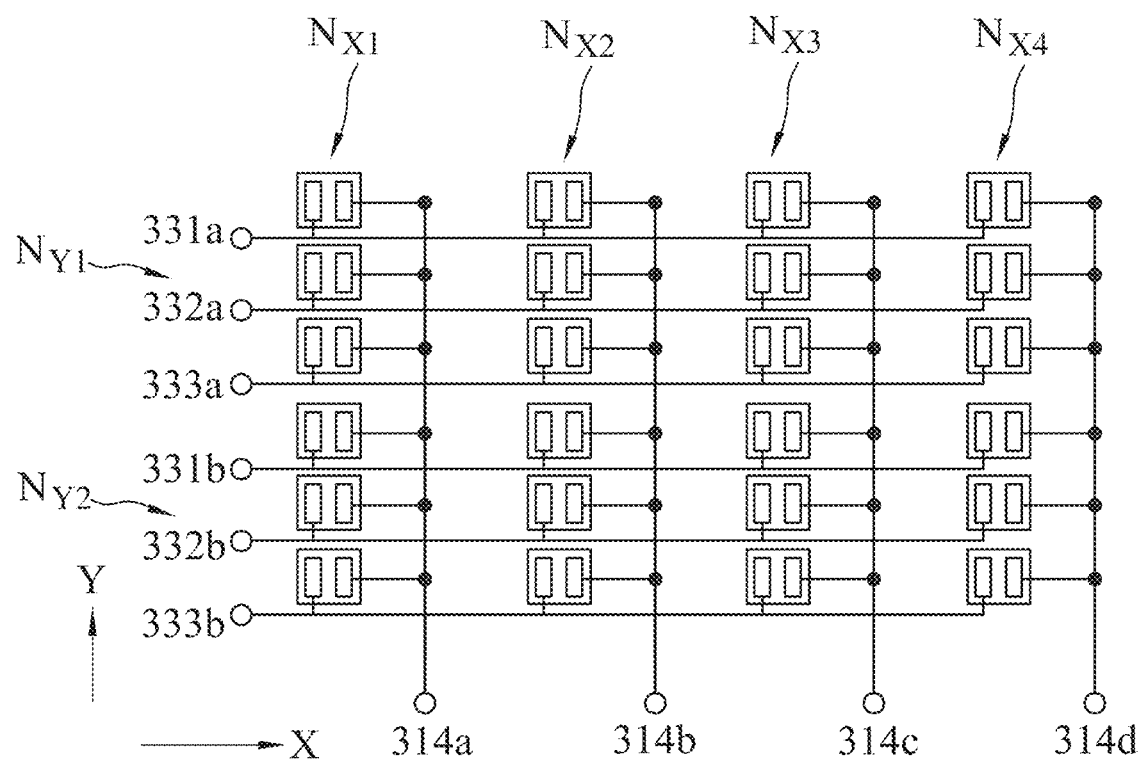
FIG. 27 is a schematic diagram illustrating an exemplary electrical connections among the light-emitting units of a light emitting device shown in FIG. 26, according to one embodiment of the disclosure.

FIG. 27 is a schematic diagram illustrating an exemplary electrical connections among the light-emitting units of the light-emitting device shown in FIG. 26, according to one embodiment of the disclosure. In this embodiment, for each of the light-emitting units, the light-emitting chips are aligned along a first direction (Y), and the two distinct terminals of each of the light-emitting chips are disposed to be aligned along a second direction (X) perpendicular to the first direction (Y).

In this embodiment, the wiring layer 300 (not shown in FIG. 27) may be configured to include a number ($N_x$) of first metal wire patterns that extend along the first direction (Y), and a number ($N_y$*a) of second metal wire patterns that extend along the second direction (X), where $N_x$=4, $N_y$=2 and a=3. The first metal wire patterns respectively correspond to four columns of the light-emitting units chips, and each of the first metal wire patterns is electrically connected to the second terminals of the light-emitting chips in the corresponding one of the columns. The second metal wire patterns respectively correspond to six rows of the light-emitting chips that are aligned along the second direction (X), and each of the second metal wire patterns is electrically connected to the first terminals of the light-emitting chips in the corresponding one of the rows. It is noted that the metal wire connections in this embodiment are similar to those described in FIG. 25, and details thereof are omitted herein. In this embodiment, a total of ten metal pads (331a, 332a, 333a, 331b, 332b, 333b, 314a, 314b, 314c, and 314d) are present, which satisfies the relation of P=Nx+Ny*3. The first metal wire patterns second metal wire patterns may be employed using electrical wires.

In this embodiment, the light-emitting units are secured using the encapsulating layer 200, and the wiring layer 300 is configured to be connected to the light-emitting units that are arranged in a two dimensional array. Furthermore, no circuit board and complicated wiring are needed, and no welding is required to secure the terminals of the light-emitting chips on a substrate, and thus potential issues related to the welding may be avoided.

Figure 28:
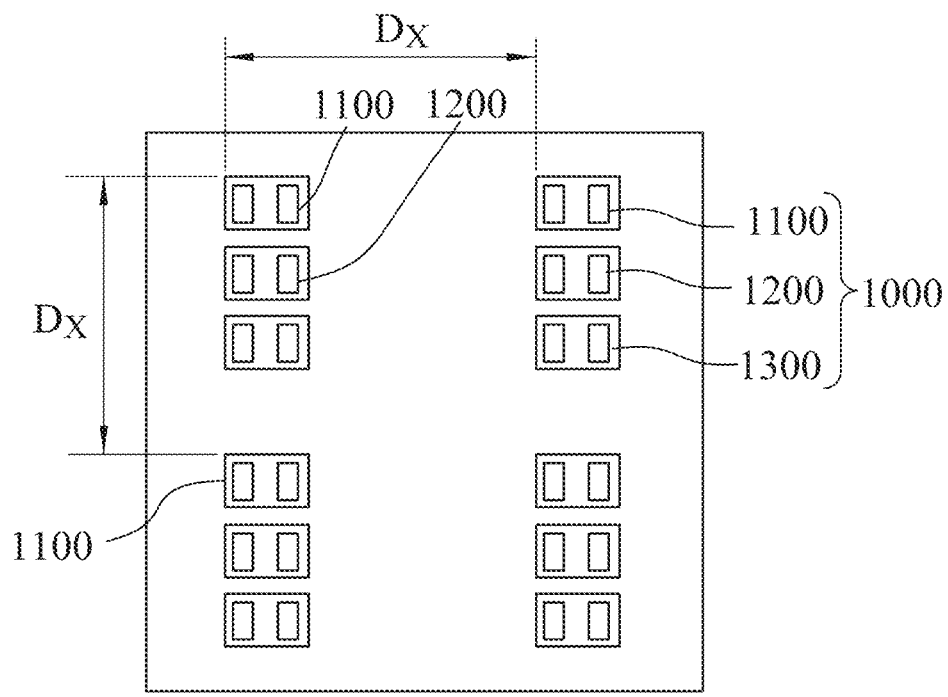
FIG. 28 is a schematic diagram of a light-emitting device according to one embodiment of the disclosure.

FIG. 28 is a schematic diagram of a light-emitting device according to one embodiment of the disclosure. In this embodiment, a number (N) of light-emitting units 1000 are present, and are arranged in an n*n array, where n equals to a square root of (N), also labeled as sqrt (N). In this embodiment, n is an integer greater than 1, and 1<N≤64.

Each of the light-emitting units 1000 includes a red light-emitting chip 1100, a blue light-emitting chip 1200 and a green light-emitting chip 1300. A distance Dx is defined as a distance between specific corners of two light-emitting chips of the same type, respectively of the two light-emitting units 1000 in the same column. For example, in the embodiment shown in FIG. 28, the distance Dx may be a distance between two upper-left corners of two red light-emitting chips 1100 of two light-emitting units 1000 in the same column. As a result, a length and a width of the light-emitting device may be Dx*n.

Figure 29:
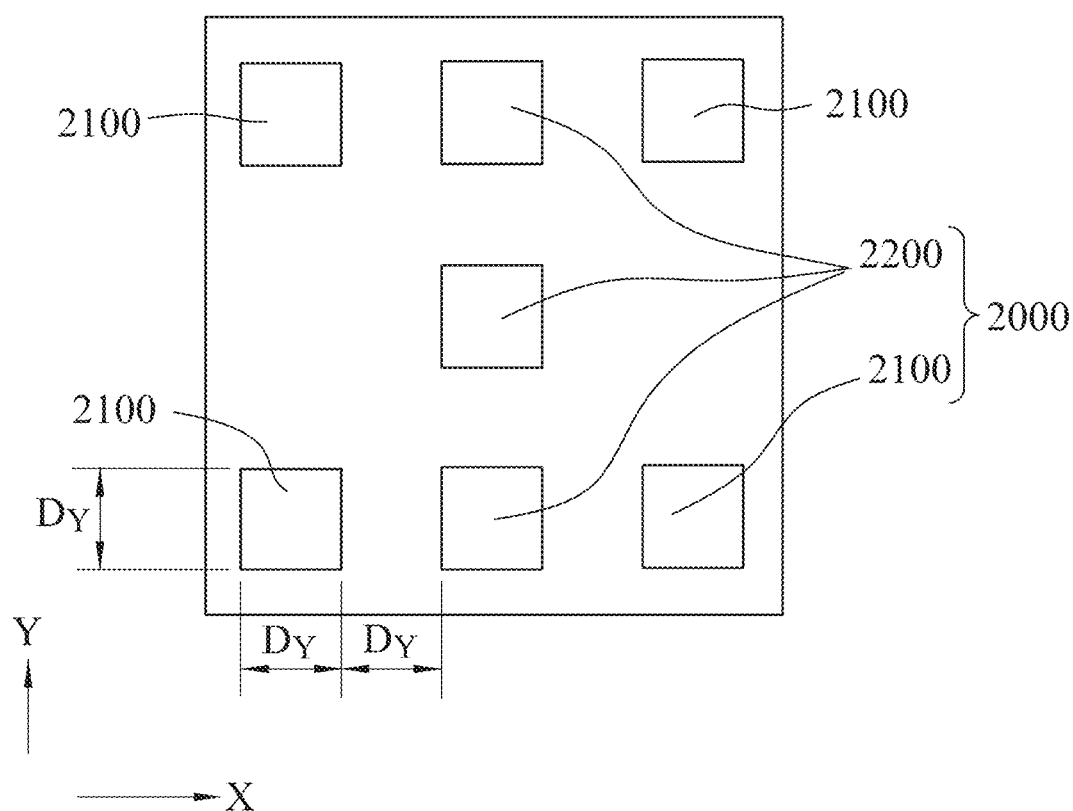
FIG. 29 illustrates a substrate that includes a plurality of metal pads, and that may be used to connect the light-emitting units shown in FIG. 28.

FIG. 29 illustrates a substrate that includes a plurality of metal pads 2000 to be connected to the light-emitting units 1000 shown in FIG. 28. In this embodiment, the number of metal pads 2000 (P) may be calculated by first rounding up a number 2*sqrt(3N) to obtain a number R, and then determining that P=R±1.

A number of the metal pads 2000 on one side of the substrate along one of the first direction (Y) and the second direction (X) may be between a rounded-up number of sqrt[2*sqrt(3N)] and a rounded-down number of sqrt[2*sqrt (3N)]. A number of the metal pads 2000 on another side of the substrate along the other one of the first direction (Y) and the second direction (X) may be a rounded-up number of sqrt[2*sqrt(3N)], and a distance between adjacent two of the metal pads 2000, a length and a width of each of the metal pads 2000 are equal to one another (labeled as "Dy"). A resulting length and width of the substrate may be 2*sqrt [2*sqrt(3N)]*Dy, and satisfy the relation of Dx≥{0.2*sqrt [2*sqrt(3N)]}/sqrt(N).

It is noted that in embodiments, one light-emitting unit 1000 may be seen as one pixel on a resulting display screen, and for each of the light-emitting units 1000, an arrangement of the red light-emitting chip 1100, the blue light-emitting chip 1200 and the green light-emitting chip 1300 is the same. As a result, the distance (Dx) may be seen as a pixel pitch of the resulting display screen, and may be defined as a distance between specific corners of two light-emitting chips of the same type.

In this embodiment, a length and a width of each the light-emitting device shown in FIG. 27 may be expressed as Dx*sqrt(N), which should be approximately equal to the length and width of the substrate shown in FIG. 28 (i.e., 2*sqrt[2*sqrt(3N)]*Dy). As a result, a relation between Dx and Dy may be expressed using the following equation:

$$[Dx \star sqrt(N)]/\{2 \star sqrt[2 \star sqrt(3N)]\} \approx Dy.$$

In practice, the length and width of the metal pads 2000 is larger than 0.1 mm, so as to achieve a heat dissipation effect of the light-emitting device, to reduce the risk of short circuit, and to facilitate the subsequent assembly (e.g., to mount the light-emitting devices onto a base board to form a display screen). As such, the length and width of the substrate (Dy) may be expressed as:

$$Dy \approx [Dx \star sqrt(N)]/\{2 \star sqrt[2 \star sqrt(3N)]\} \geq 0.1 \text{ mm}.$$

In turn, a relation between the pixel pitch (Dx) and the number (N) of the light-emitting units 1000 may be expressed as:

$$Dx \geq \{0.2 \star sqrt[2 \star sqrt(3N)]\}/sqrt(N).$$

In practice, the pixel pitch (Dx) is predetermined. As such, the number (N) may be selected to satisfy the above equation, so as to retain the aforesaid effects of the light-emitting device while maintaining the desired pixel pitch.

A list of exemplary relations among the number (N) and the resulting number of metal pads (P) is shown in Table 1 below. In this embodiment, the number of the metal pads 2000 (P) may be calculated by first rounding up a number 2*sqrt (3N) to obtain a number R, and then determining that P=R±1.

TABLE 1

| N | 2*sqrt (3N) | Round-up | P |
|---|---|---|---|
| 4 | 6.92820323 | 7 | 7 |
| 9 | 10.39230485 | 11 | 12 |
| 16 | 13.85640646 | 14 | 14 |
| 36 | 20.78460969 | 21 | 21 |
| 64 | 27.71281292 | 28 | 28 |

A list of exemplary relations among the number (N) and the resulting numbers of metal pads along the first direction (Y) [denoted as (Ny)], and along the second direction (X) [denoted as (Nx)], is shown in Table 2 below. It is noted that, a number of the metal pads 2000 on one side of the substrate along one of the first direction (Y) and the second direction (X) may be between a rounded-up number of sqrt[2*sqrt (3N)] to a rounded-down number of sqrt[2*sqrt (3N)].

TABLE 2

| N | sqrt [2*sqrt (3N)] | Round-up | Round-down | Nx | Ny |
|---|---|---|---|---|---|
| 4 | 2.632148026 | 3 | 2 | 3 | 2 |
| 9 | 3.223709795 | 4 | 3 | 3 | 4 |
| 16 | 3.722419436 | 4 | 3 | 4 | 4 |
| 36 | 4.559014114 | 5 | 4 | 5 | 5 |
| 64 | 5.264296052 | 6 | 5 | 5 | 6 |

It is noted that, when the total number (P) is within the range shown in the Table 1 and one of the numbers (Nx) and (Ny) is a rounded-up number of sqrt[2*sqrt(3N)], the other one of the numbers (Nx) and (Ny) is smaller than the rounded-up number of sqrt[2*sqrt(3N)]. In this configuration, a length and a width of the metal pads 2000 (Dy) are equal to one another, and a distance between adjacent two of the metal pads 2000 is not smaller than the length and the width of the metal pads 2000. As such, the resulting length and width of the metal pads 2000 are not smaller than 0.1 mm.

In one embodiment, a length and a width of the metal pads 2000 (Dy) are equal to one another, and are not smaller than 0.1 mm.

In one embodiment, along one of the first direction (Y) and the second direction (X), a distance between adjacent two of the metal pads 2000 is not smaller than 0.1 mm.

In one embodiment, both of the numbers (Nx) and (Ny) is a rounded-up number of sqrt[2*sqrt(3N)]. A distance between adjacent two of the metal pads 2000 on an outer row of the substrate and a distance between adjacent two of the metal pads 2000 on an outer column of the substrate are equal to each other.

In one embodiment, one of the numbers (Nx) and (Ny) is a rounded-up number of sqrt[2*sqrt(3N)], and another one of the numbers (Nx) and (Ny) is a rounded-down number of sqrt[2*sqrt(3N)]. Along a side where the number of metal pads 2000 is the rounded-up number of sqrt[2*sqrt (3N)], a distance between adjacent two of the metal pads 2000 is greater than a distance between adjacent two of the metal pads 2000 along another side where the number of the metal pads 2000 is the rounded-down number of sqrt[2*sqrt(3N)].

In one embodiment, a length and a width of the light-emitting device are equal to each other.

In one embodiment, a number of the light-emitting units along the first direction (Y) and a number of the light-emitting units along the second direction (X) are equal to each other.

In one embodiment, the metal pads 2000 may be categorized into a number of first metal pads 2100 and a number of second metal pads 2200. Each of the light-emitting chips 100 is electrically connected to a unique combination of one of the first metal pads 2100 and one of the second metal pads 2200.

In one embodiment, each of the first metal pads 2100 is connected to one of a power supply voltage and a ground reference voltage, and each of the second metal pads 2200 is connected to the other one of the power supply voltage and the ground reference voltage.

In one embodiment, a number of the first metal pads 2100 is equal to a number of the light-emitting units 1000 (N). Each of the light-emitting units 1000 includes a common node, and the common node is electrically connected to a corresponding one of the first metal pads 2100.

In one implementation of the abovementioned embodiments, as shown in FIG. 28, the number (N) equals to 4, a total of twelve light-emitting chips are included, and seven metal pads 2000 are present to be connected to the light-emitting chips. Specifically, four first metal pads 2100 are present, and the common nodes of the light-emitting units 1000 are respectively connected to the four first metal pads 2100.

The N-in-one light emitting device of the embodiments is configured to enclose a number of pixels that maintains a relatively small pixel pitch. Since the dimensions (length, width, thickness) of the light emitting device are designed to be larger than 0.1 mm, a heat dissipation effect of the light-emitting device is achieved, the risk of short circuit is reduced, and the subsequent assembly (e.g., to mount the light-emitting devices onto a base board to form a display screen) may be facilitated. As such, the N-in-one light-emitting device may be used in applications that employ fine pixel pitch (PFF) LEDs.

According to one embodiment of the disclosure, there is provided a display screen that is assembled using a plurality of the light emitting devices as disclosed in the aforesaid embodiments.

In some embodiments, a diagonal, a length and a width of the display screen may satisfy a ratio of 18.36:16:9.

To sum up, embodiments of the disclosure provide an N-in-one light-emitting device. The light-emitting device includes a number (N) of light-emitting units, and a plurality of metal pads. Each of the light-emitting units includes a red light-emitting chip, a green light-emitting chip and a blue light-emitting chip. A distance between specific corners of two light-emitting chips of the same type (Dx) in the same column and the number (N) of the light-emitting units satisfies the following equation: Dx≥{0.2*sqrt[2*sqrt(3N)]}/sqrt(N).

In such configuration, when the distance between specific corners of two light-emitting chips of the same type (Dx) is preset, the N-in-one light emitting device of the embodiments is configured to enclose a number of pixels that maintains a relatively small pixel pitch. Since the dimension of the light emitting device is designed to be larger than 0.1 mm, a heat dissipation effect of the light-emitting device is achieved, the risk of short circuit is reduced, and the subsequent assembly may be facilitated. As such, the N-in-one light-emitting device may be used in applications that employ fine pixel pitch (PFF) LEDs.

The embodiments of the disclosure further provide a display screen that is assembled using a plurality of the light-emitting device as described above.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting device comprising:
a number (N) of light-emitting units, each of said light-emitting units including a number (n) of light-emitting chips each having a first terminal and a second terminal that have opposite polarities, where N is an integer greater than one, and n is an integer greater than or equal to three;
a number (a) of first metal pads electrically connected to said first terminals of said light-emitting chips, where a is an integer equal to or greater than one; and
a number (b) of second metal pads electrically connected to said second terminals of said light-emitting chips, where b is an integer equal to or greater than one,
wherein each of said light-emitting chips is electrically connected to one of the number (a) of first metal pads and one of the number (b) of second metal pads, and
wherein the numbers (N), (n), (a) and (b) satisfy an equation of a*b=n*N;
wherein:
the number (a) is equal to one;
each of said light-emitting units includes a common node among said first terminals of said light-emitting chips, and said common node is electrically connected to said first metal pad; and
each light-emitting chip included in each of said light-emitting units is electrically connected to a respective one of the said second metal pads;
each of said light-emitting units includes a red light-emitting chip, a green light-emitting chip and a blue light-emitting chip that are configured to emit red light, green light and blue light, respectively; and
the equation is simplified into b=3*N.

2. The light-emitting device of claim 1, further comprising a mask material surrounding a side surface of each of said light-emitting units, and exposing said first terminals and said second terminals of said light-emitting chips.

3. The light-emitting device of claim 1, further comprising, an electric circuit layer, a via sub-layer and a welding layer disposed below said light-emitting units in such order, wherein:
said electric circuit layer includes a first insulating layer that is in contact with said light-emitting units, and a wiring section that is embedded in said first insulating layer and that is in contact with said terminals of said light-emitting chips;
said via sub-layer includes a second insulating layer that is in contact with said first insulating layer and that has a number of through holes, and a number of metal wires disposed in the through holes to contact said wiring section; and
said welding layer includes said first metal pads and said second metal pads that are disposed to be electrical connected to said metal wires.

4. The light-emitting device of claim 3, further comprising routing wires that interconnect said wiring section to said welding layer.

5. The light-emitting device of claim 4, further comprising a third insulating layer that surrounds said first metal pads, said second metal pads and said routing wires.

6. The light-emitting device of claim 5, wherein each of said first, second and third insulating layers includes a black electrically insulating material.

7. A display screen that comprises a plurality of light-emitting devices as claimed in claim 1.

8. A light-emitting device, comprising:
a number (N) of light-emitting units, each of said light-emitting units including a number (n) of light-emitting chips each having a first terminal and a second terminal that have opposite polarities, where N is an integer greater than one, and n is an integer greater than or equal to three;
a number (a) of first metal pads electrically connected to said first terminals of said light-emitting chips, where a is an integer equal to or greater than one; and
a number (b) of second metal pads electrically connected to said second terminals of said light-emitting chips, where b is an integer equal to or greater than one,
wherein each of said light-emitting chips is electrically connected to one of the number (a) of first metal pads and one of the number (b) of second metal pads, and
wherein the numbers (N), (n), (a) and (b) satisfy an equation of a*b=n*N;
the light-emitting device further comprising:
an encapsulating layer that surrounds a side surface of each of said light-emitting chips;
at least one wiring layer that is disposed on said one surface of each of said light-emitting chips; and
a plurality of metal pads disposed on said wiring layer,
wherein said light-emitting units that are arranged in an $N_x*N_y$ two-dimensional array, where N and n are integers and N≥3;
wherein said wiring layer includes electrical wires that connect said light-emitting chips to said metal pads, and the number of metal pads equals to $N_x+N_y*a$;
wherein said light-emitting units are arranged in a manner such that $(N_x+N_y*a)$ has a minimum value;
wherein said wiring layer further comprises:
a number ($N_x$) of first wirings respectively corresponding to a number ($N_x$) of columns of said light-emitting chips that are aligned along a first direction, each of said first wirings being electrically connected to said second terminals of said light-emitting chips in the corresponding one of the columns; and
a number ($N_y*a$) of second wirings respectively corresponding to a number ($N_y*a$) of rows of said light-emitting chips that are aligned along a second direction, each of said second wirings being electrically connected to said first terminals of said light-emitting chips in the corresponding one of the rows.

9. The light-emitting device of claim 8, wherein $N_x>N_y$.

10. The light-emitting device of claim 8, wherein, for each of said light-emitting units, said light-emitting chips are aligned along a first direction, and
wherein the terminals of each of said light-emitting chips are disposed to be aligned along a second direction.

11. The light-emitting device of claim 8, wherein $1<N_x/N_y\leq5$.

12. The light-emitting device of claim 8, wherein $N=2^{2k}$, $N_x:N_y=4:1$, and k is a natural number.

13. The light-emitting device of claim 8, wherein $N=3^{2k+1}$, $N_x:N_y=3:1$, and k is a non-negative integer.

14. The light-emitting device of claim 8, wherein each of said light-emitting units is disposed to have a maximum distance of 0.8 mm from one another.

15. The light-emitting device of claim 8, wherein said wiring layer includes:
a first sub-wiring layer that is disposed directly on said one surface of each of said light-emitting chips;
a second sub-wiring layer that includes electrical wires to be connected to said metal pads; and
a via sub-layer that is disposed between said first sub-wiring layer and second sub-wiring layer, and that has a number of through holes for establishing electrical connection between each of said light-emitting chips and said metal pads.

16. The light-emitting device of claim 15, wherein said via sub-layer has a thickness ranging from 20 μm to 80 μm.

17. The light-emitting device of claim 8, which has a thickness from ranging 100 μm to 500 μm.

18. The light-emitting device of claim 8, which has a thickness within one of a range from 120 μm to 200 μm and a range from 320 μm to 500 μm.

19. The light-emitting device of claim 8, wherein said wiring layer includes a number (k) of sub-layers that are electrically insulated from one another, and (k)≤4.

20. The light-emitting device of claim 19, wherein at least one of the number (k) of sub-layers has a thickness less than 50 μm.

21. The light-emitting device of claim 19, wherein at least one of the number (k) of sub-layers has a thickness greater than 60 μm.

22. The light-emitting device of claim 8, wherein:
the number (a) is equal to the number (N); and
each of said light-emitting units includes a common node among said first terminals of said light-emitting chips, and said common node is electrically connected to a corresponding one of said first metal pads.

23. The light-emitting device of claim 22, wherein:
the number (b) of second metal pads includes at least three second metal pads;
each of said light-emitting units includes a red light-emitting chip, a green light-emitting chip and a blue light-emitting chip, which are configured to emit red light, green light and blue light, respectively; and
said red light-emitting chip included in each of said light-emitting units, said green light-emitting chip included in each of said light-emitting units and said blue light-emitting chip included in each of said light-emitting units are electrically connected to said second metal pads, respectively.

24. The light-emitting device of claim 23, wherein:

the number (b) of second metal pads includes four second metal pads;

each of said light-emitting units further includes a white light-emitting chip that is configured to emit white light; and said red light-emitting chip included in each of said light-emitting units, said green light-emitting chip included in each of said light-emitting units, said blue light-emitting chip included in each of said light-emitting units, and said white light-emitting chip included in each of said light-emitting units are electrically connected to said second metal pads, respectively.

* * * * *